(12) United States Patent
Hsu et al.

(10) Patent No.: US 11,705,462 B2
(45) Date of Patent: Jul. 18, 2023

(54) ELECTRONIC DEVICE

(71) Applicant: Au Optronics Corporation, Hsinchu (TW)

(72) Inventors: Ya-Ling Hsu, Hsinchu (TW); Min-Tse Lee, Hsinchu (TW); Ti-Kuei Yu, Hsinchu (TW); Yueh-Chi Wu, Hsinchu (TW); Shu-Wen Liao, Hsinchu (TW); Hung-Chia Liao, Hsinchu (TW); Yueh-Hung Chung, Hsinchu (TW); Jia-Hong Wang, Hsinchu (TW); Ping-Wen Chen, Hsinchu (TW); Sheng-Yen Cheng, Hsinchu (TW); Chen-Hsien Liao, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 354 days.

(21) Appl. No.: 16/995,806

(22) Filed: Aug. 17, 2020

(65) Prior Publication Data
US 2021/0057452 A1 Feb. 25, 2021

Related U.S. Application Data

(60) Provisional application No. 62/901,837, filed on Sep. 18, 2019, provisional application No. 62/889,181, filed on Aug. 20, 2019.

(30) Foreign Application Priority Data

Aug. 3, 2020 (CN) .......................... 202010768982.4

(51) Int. Cl.
*H01L 27/12* (2006.01)

(52) U.S. Cl.
CPC .................................. *H01L 27/124* (2013.01)

(58) Field of Classification Search
CPC ............... H01L 27/124; H01L 27/3276; G02F 1/136218; G02F 1/136286
See application file for complete search history.

(56) References Cited

U.S. PATENT DOCUMENTS 8,542,328 B2  9/2013  Chang et al.
8,823,683 B2  9/2014  Chung et al.
(Continued)

FOREIGN PATENT DOCUMENTS

CN  201289561 Y  *  8/2009
CN  201845775      5/2011
(Continued)

*Primary Examiner* — Peter M Albrecht
(74) *Attorney, Agent, or Firm* — JCIPRNET

(57) ABSTRACT

An electronic device includes a substrate, multiple transversal signal lines, a first vertical signal line, a second vertical signal line, a shielding wire, and multiple pixel structures. The first vertical signal line is intersected with the transversal signal lines. The second vertical signal line is intersected with the transversal signal lines and connected to one of the transversal signal lines. An orthogonal projection of the shielding wire on the substrate is located between an orthogonal projection of the first vertical signal line and an orthogonal projection of the second vertical signal line on the substrate. One of the pixel structures is surrounded by a corresponding one of the transversal signal lines and the second vertical signal line and includes an active device. A gate and a source of the active device is electrically connected to the corresponding one transversal signal line and the first vertical signal line respectively.

20 Claims, 13 Drawing Sheets

(56) References Cited

U.S. PATENT DOCUMENTS

| | | | |
|---|---|---|---|
| 9,356,051 | B2 | 5/2016 | Wu et al. |
| 9,429,780 | B2 | 8/2016 | Jo et al. |
| 9,646,559 | B2 | 5/2017 | Min et al. |
| 10,365,526 | B2 | 7/2019 | Hao |
| 2001/0007362 | A1* | 7/2001 | Ha ................. H01L 27/124 257/154 |
| 2001/0043304 | A1 | 11/2001 | Matsumoto |
| 2002/0097365 | A1 | 7/2002 | Yang et al. |
| 2011/0063535 | A1 | 3/2011 | Chang et al. |
| 2011/0292312 | A1 | 12/2011 | Kim et al. |
| 2014/0168552 | A1 | 6/2014 | Jo et al. |
| 2014/0168553 | A1 | 6/2014 | Park et al. |
| 2015/0187805 | A1 | 7/2015 | Jang et al. |
| 2017/0110091 | A1 | 4/2017 | Huang et al. |
| 2017/0117307 | A1* | 4/2017 | Shih ................. H01L 27/1288 |
| 2019/0025658 | A1 | 1/2019 | Hao |
| 2020/0278584 | A1* | 9/2020 | Kajita ............... G02F 1/136286 |

FOREIGN PATENT DOCUMENTS

| | | | |
|---|---|---|---|
| CN | 102289114 A | * | 12/2011 |
| CN | 102403320 | | 4/2012 |
| CN | 202548496 | | 11/2012 |
| CN | 103578443 | | 2/2014 |
| CN | 103869564 | | 6/2014 |
| CN | 104808356 | | 7/2015 |
| CN | 106504689 | | 3/2017 |
| CN | 107219702 | | 9/2017 |
| KR | 20150000027 A | * | 1/2015 |
| TW | 201109804 | | 3/2011 |
| TW | I609214 | | 12/2017 |

* cited by examiner

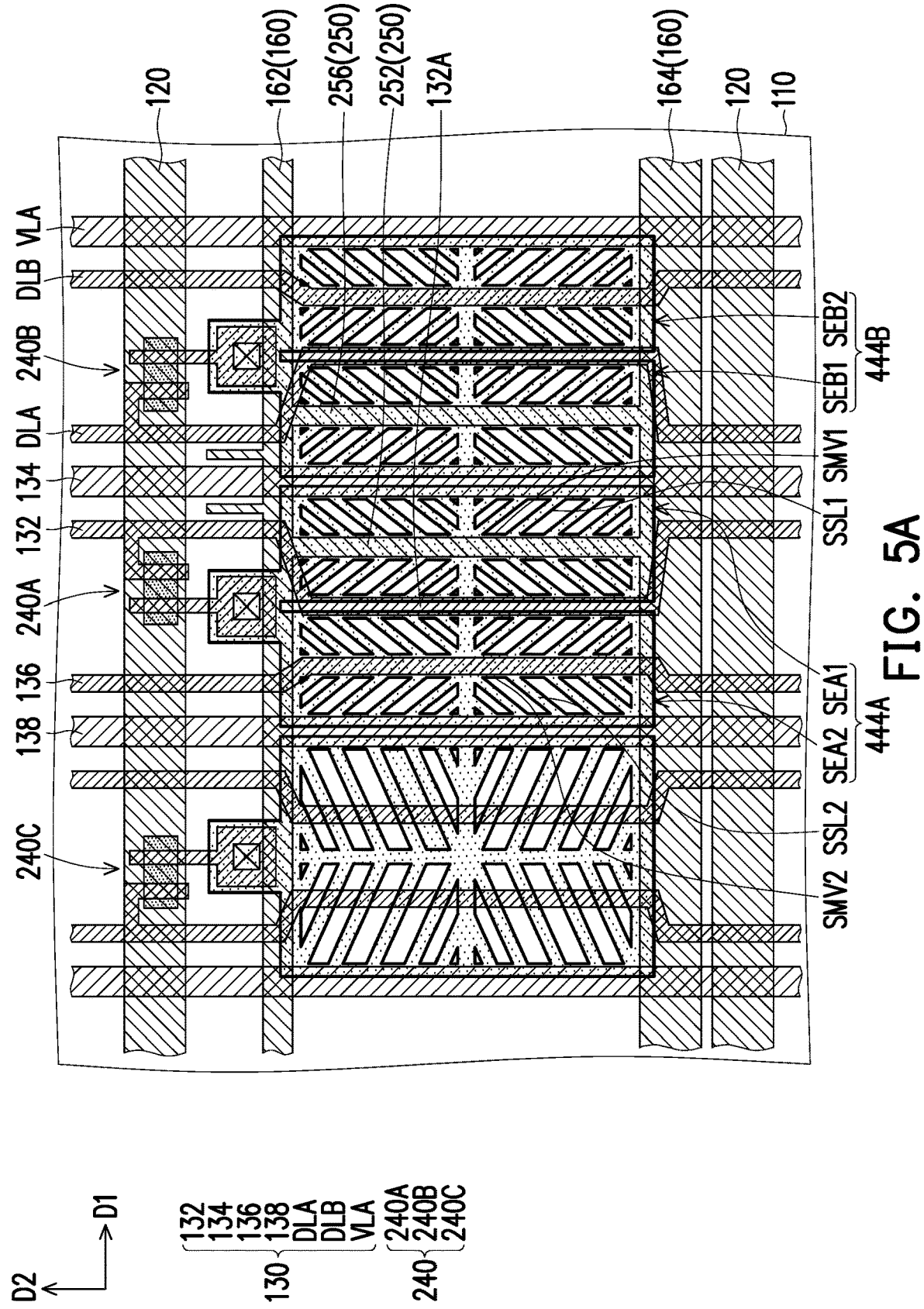

ELECTRONIC DEVICE

CROSS-REFERENCE TO RELATED APPLICATION

This application claims the priority benefits of U.S. provisional application Ser. No. 62/889,181, filed on Aug. 20, 2019, U.S. provisional application Ser. No. 62/901,837, filed on Sep. 18, 2019, and China application serial no. 202010768982.4, filed on Aug. 3, 2020. The entirety of each of the above-mentioned patent applications is hereby incorporated by reference herein and made a part of this specification.

BACKGROUND

Technical Field

The disclosure relates to an electronic device.

Description of Related Art

In order to achieve convenience in usage and operation, display technology has been widely used in various electronic devices, where different electronic devices probably need to provide a display function in regions of different sizes and different shapes. Therefore, wires and circuits related to the display function probably face different issues in layout designs. For example, how to reduce a layout area of a peripheral circuit of a display region, how to provide the display function in areas with different shapes, etc., are all issues encountered in manufacturing and design of the electronic devices.

SUMMARY

The disclosure is directed to an electronic device capable of providing an ideal display effect.

In an embodiment of the disclosure, the electronic device includes a substrate, a plurality of transversal signal lines, a first vertical signal line, a second vertical signal line, a shielding wire, and a plurality of pixel structures. The transversal signal lines extend in a first direction and are disposed on the substrate. The first vertical signal line extends in a second direction, is disposed on the substrate, and is intersected with the transversal signal lines. The second vertical signal line is disposed on the substrate and intersected with the transversal signal lines. The second vertical signal line is connected to one of the transversal signal lines. An orthogonal projection of the shielding wire on the substrate is located between an orthogonal projection of the first vertical signal line on the substrate and an orthogonal projection of the second vertical signal line on the substrate. One of the pixel structures is surrounded by a corresponding one of the transversal signal lines and the second vertical signal line and includes an active device. A gate of the active device is electrically connected to the corresponding one of the transversal signal lines, and a source of the active device is electrically connected to the first vertical signal line.

In an embodiment of the disclosure, the electronic device includes a plurality of transversal signal lines, a first vertical signal line, a second vertical signal line, and a plurality of pixel structures. The first vertical signal line is intersected with the transversal signal lines. The second vertical signal line is intersected with the transversal signal lines, and the second vertical signal line is connected to one of the transversal signal lines. One of the pixel structures is surrounded by a corresponding one of the transversal signal lines and the first vertical signal line and includes an active device and a pixel electrode. A gate of the active device is electrically connected to the corresponding one transversal signal line, a source of the active device is electrically connected to the first vertical signal line, the pixel electrode is electrically connected to a drain of the active device, and the first vertical signal line is overlapped with the pixel electrode.

According to the above description, the electronic device provided by the embodiments of the disclosure includes the shielding wire disposed between the adjacent vertical signal lines, and the shielding wire and the veridical signal lines may be disposed corresponding to the pixel structure to ensure the quality of the electronic device.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 5A is a partial schematic top view of an electronic device according to another embodiment of the disclosure.

DESCRIPTION OF THE EMBODIMENTS

Figure 1:
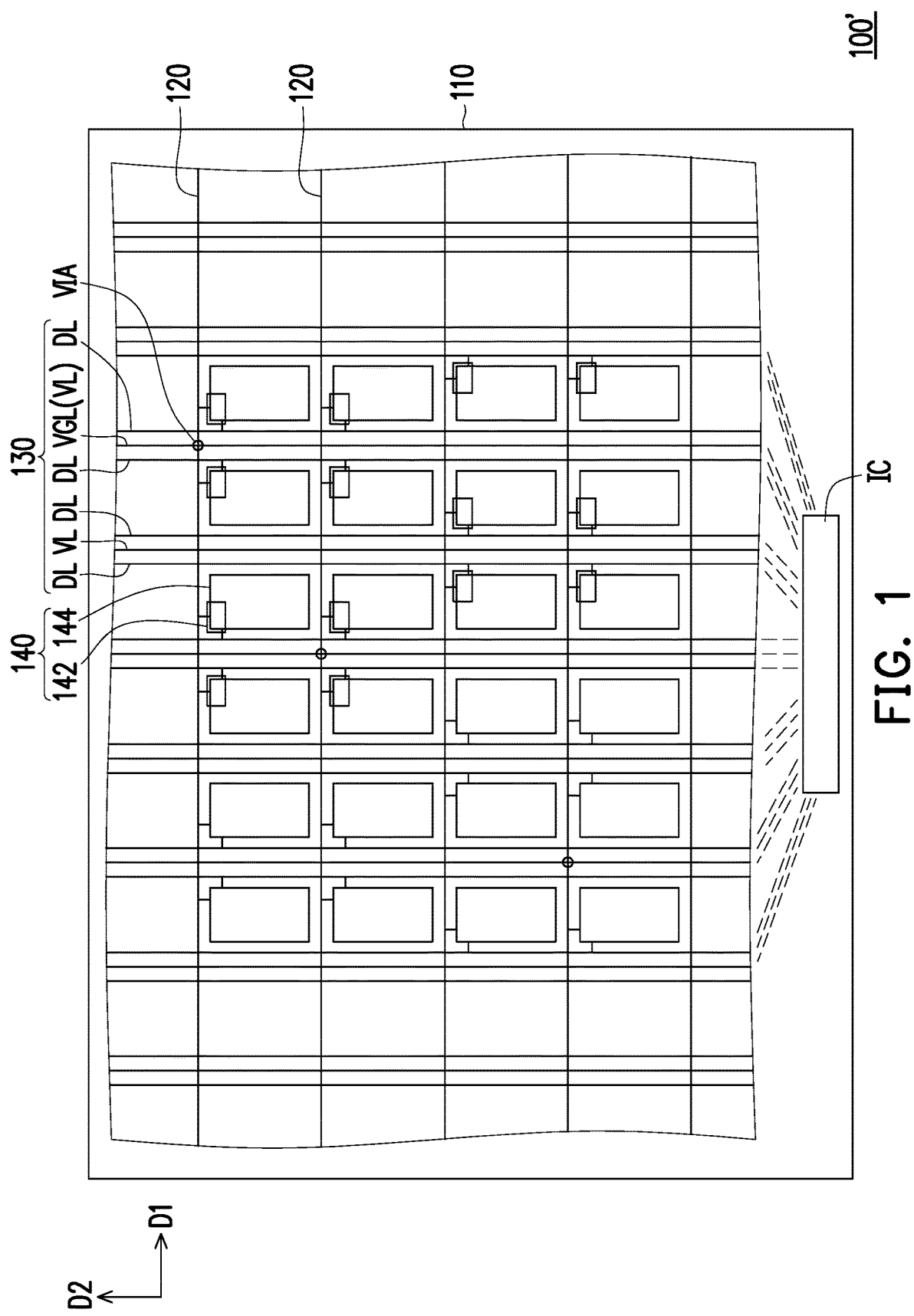
FIG. 1 is a partial schematic top view of an electronic device.

FIG. 1 is a partial schematic top view of an electronic device. In FIG. 1, an electronic device 100' includes a substrate 110, a plurality of transversal signal lines 120, a plurality of vertical signal lines 130, and a plurality of pixel structures 140. The pixel structures 140 are disposed on the substrate 110 in an array arrangement. In other words, the pixel structures 140 are arranged in a first direction D1 and a second direction D2 intersected with the first direction D1. In terms of the pixel structures 140 arranged in a row along the first direction D1, each of the pixel structures 140 is connected to one of the transversal signal lines 120. Moreover, the vertical signal lines 130 may be divided into vertical signal lines DL directly connected to the pixel structures 140 and vertical signal lines VL not directly connected to the pixel structures 140. The pixel structures 140 arranged in a row along the first direction D1 are sandwiched between two vertical signal lines DL, and each of the pixel structures 140 is connected to one of the vertical signal lines DL. In some embodiments, the different pixel structures 140 arranged in a same column along the second direction D2 may be respectively connected to the vertical signal line DL on a first side and the vertical signal line DL on an opposite second side. Each of the vertical signal lines VL is sandwiched between two columns of the pixel structures 140 and two vertical signal lines DL, and at least a part of the vertical signal lines VL is connected to the transversal signal lines 120.

In some embodiments, the electronic device 100' may further include a driving circuit IC, and the driving circuit IC is located at one end of the vertical signal lines 130. The vertical signal lines DL and the vertical signal lines VL may directly receive signals provided by the driving circuit IC, and the transversal signal lines 120 may receive the corresponding signals through at least a part of the vertical signal lines VL (VGL). In some embodiments, a part of the vertical signal lines VL in the electronic device 100' may not be used to transmit the signal required by the transversal signal lines 120, but may be input with a direct current (DC) potential. In this way, it is unnecessary to configure wires or related circuits used for transmitting signals at two ends of the electronic device 100' in the first direction D1, so as to achieve a narrow border design, and a contour of the electronic device 100' is not limited. For example, from a top-view perspective, the electronic device 100' may have a non-rectangular contour.

In some embodiments, each of the pixel structures 140 may include an active device 142 and a pixel electrode 144 connected to the active device 142, where each of the active devices 142 may be a transistor having a gate, a source, and a drain. The gate may be connected to one of the transversal signal lines 120, the source is connected to one of the vertical signal lines 130, and the drain is connected to the pixel electrode 144. In addition, each of the transversal signal lines 120 is connected to one of the vertical signal lines VGL. Therefore, a signal of the gate of the active device 142 may be transmitted to the transversal signal line 120 from the vertical signal line VGL, and then input to the gate through the transversal signal line 120. To be specific, in order to avoid a short circuit between the transversal signal lines 120 and the vertical signal lines 130, the transversal signal lines 120 and the vertical signal lines 130 may be formed by different film layers, and there may be one or a plurality of insulating layers sandwiched between the transversal signal lines 120 and the vertical signal lines 130. In some embodiments, in order to transmit the signal from the vertical signal line VGL to the transversal signal line 120, a conducting structure VIA may be configured between the corresponding vertical signal line VGL and the transversal signal line 120. In this way, the signal required by the gate may be transmitted to the transversal signal line 120 from the vertical signal line VGL through the conducting structure VIA, and then transmitted to the gate from the transversal signal line 120.

Figure 2A:
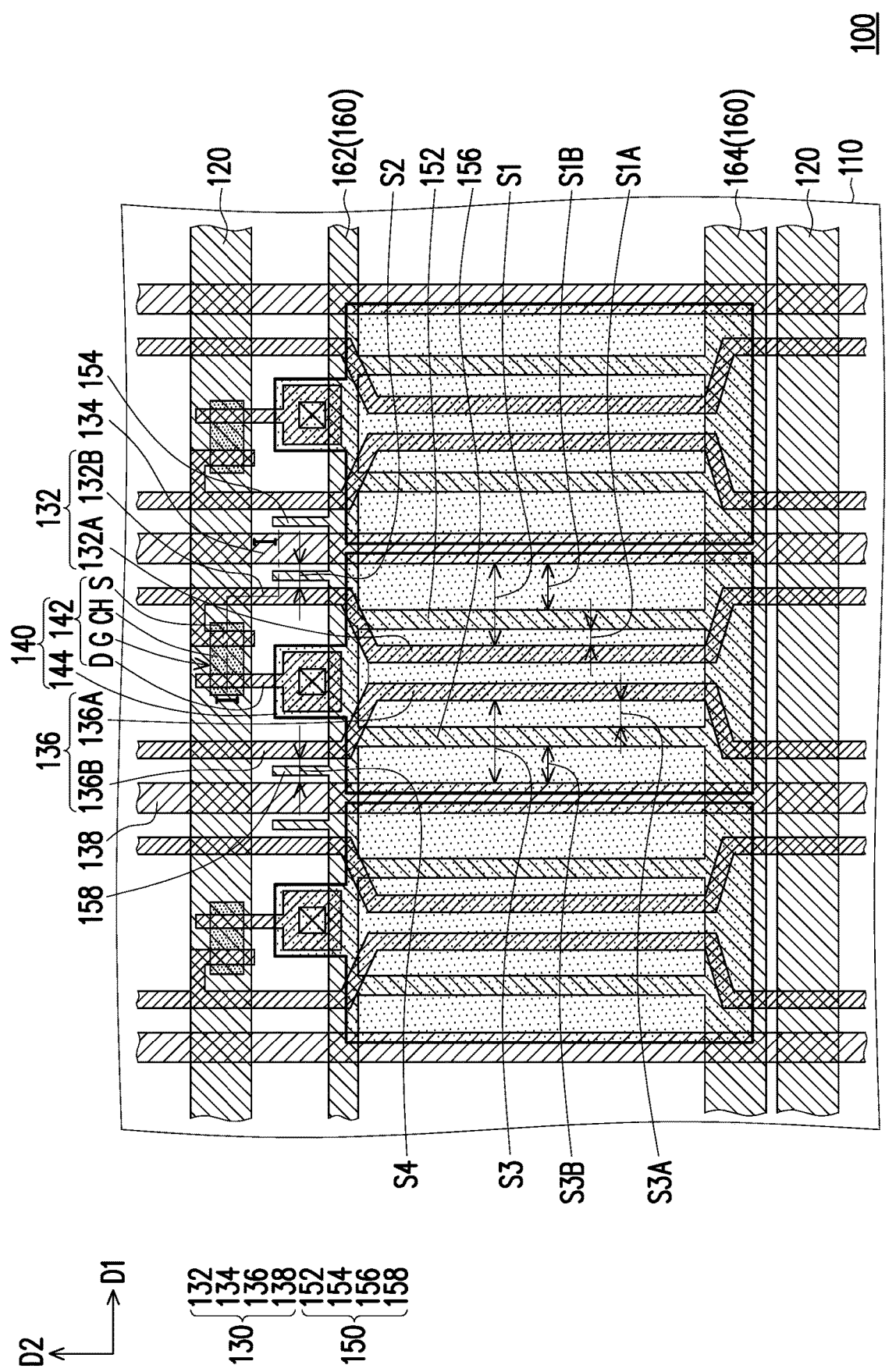
FIG. 2A is a partial schematic top view of an electronic device according to an embodiment of the disclosure.

FIG. 2A is a partial schematic top view of an electronic device according to an embodiment of the disclosure. An electronic device 100 of FIG. 2A has a layout design substantially similar to that of the electronic device 100' of FIG. 1, so that the same symbols are adopted to denote the same components. The electronic device 100 includes the substrate 110, a plurality of the transversal signal lines 120, a plurality of the vertical signal lines 130, a plurality of the pixel structures 140, and a plurality of shielding wires 150. For simplicity's sake, the signal lines around the single pixel structure 140 are described below.

To be specific, the transversal signal lines 120 respectively extend in the first direction D1, and the vertical signal lines 130 respectively extend in the second direction D2 and are intersected with the transversal signal lines 120. The vertical signal lines 130 may include a first vertical signal line 132 and a second vertical signal lines 134. The first vertical signal line 132 extends in the second direction D2 and is intersected with the transversal signal lines 120. The second vertical signal line 134 is also intersected with the transversal signal lines 120, and the second vertical signal line 134 may be connected to one of the transversal signal lines 120 (referring to FIG. 1, the second vertical signal line 134 may be connected to one of the transversal signal lines 120 through the corresponding conducting structure VIA). One of the pixel structures 140 is surrounded by a corresponding one of the transversal signal lines 120 and the second vertical signal line 134, and the pixel structure 140 includes the active device 142 and the pixel electrode 144. The active device 142 includes a gate G, a source S, a drain D, and a semiconductor layer CH. The gate G is electrically connected to a corresponding transversal signal line 120, the source S and the drain D are located on two sides of the semiconductor layer CH, and the source S is electrically connected to the first vertical signal line 132. In addition, the pixel structure 140 may further include the pixel electrode 144, and the drain D of the active device 142 may be connected to the pixel electrode 144.

The first vertical signal line 132 is disposed adjacent to the second vertical signal line 134, however, a signal transmitted by the first vertical signal line 132 is a data signal provided to the pixel structure 140, and a signal transmitted by the second vertical signal line 134 is a gate signal provided to the transversal signal line 120. Therefore, the adjacent arrangement of the first vertical signal line 132 and the second vertical signal line 134 may probably cause mutual interference of the signals transmitted by the two vertical signal lines 132 and 134. In the embodiment, an orthogonal projection of the shielding wire 150 on the substrate 110 is located between an orthogonal projection of the first vertical signal line 132 on the substrate 110 and an orthogonal projection of the second vertical signal line 134 on the substrate 110, so that the arrangement of the shielding wire 150 helps to reduce the phenomenon of signal interference between the first vertical signal line 132 and the second vertical signal line 134. In some embodiments, the shielding wire 150 and the transversal signal lines 120 may be of the same film layer, and the shielding wire 150 is located between adjacent two of the transversal signal lines 120.

The first vertical signal line 132 includes a transversal shift section 132A and a connection section 132B, where the connection section 132B traverses the transversal signal line 120, and the transversal shift section 132A is further away from the second vertical signal line 134 relative to the connection section 132B. In other words, a distance S1 between the second vertical signal line 134 and the transversal shift section 132A is greater than a distance S2 between the second vertical signal line 134 and the connection section 132B. The shielding wire 150 may include a shielding wire 152 and a shielding wire 154. An orthogonal projection of the shielding wire 152 on the substrate 110 is located between an orthogonal projection of the transversal shift section 132A on the substrate 110 and the orthogonal projection of the second vertical signal line 134 on the substrate 110, and the pixel electrode 144 is overlapped with the transversal shift section 132A and the shielding wire 152. An orthogonal projection of the shielding wire 154 on the substrate 110 is located between an orthogonal projection of the connection section 132B on the substrate 110 and the orthogonal projection of the second vertical signal line 134 on the substrate 110. Moreover, a distance S1A between the shielding wire 152 and the transversal shift section 132A and a distance S1B between the shielding wire 152 and the second vertical signal line 134 may be selectively the same or different. The design of the shielding wire 150 between the second vertical signal line 134 and the first vertical signal line 132 helps to reduce the signal interference between the second vertical signal line 134 and the first vertical signal line 132.

Figure 2B:
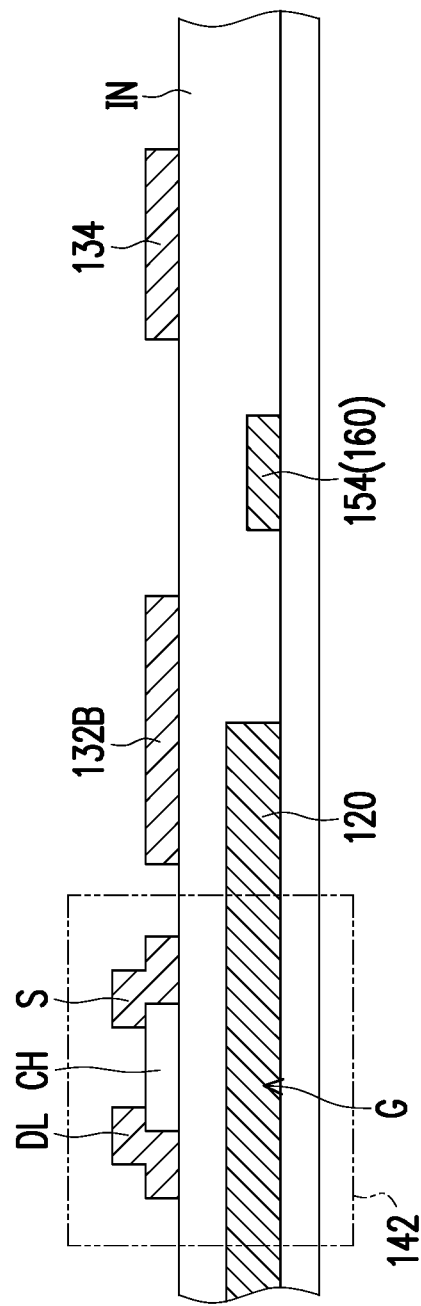
FIG. 2B is a schematic cross-sectional view of the electronic device of FIG. 2A along a line I-I.

The electronic device 100 may further include a common electrode line 160. The common electrode line 160 and the transversal signal lines 120 may also be of the same film layer, and the common electrode line 160 is located between two of the transversal signal lines 120. The shielding wire 150 is connected to the common electrode line 160, so that the shielding wire 150 is not connected to any transversal signal line 120. The common electrode line 160, for example, includes a first common electrode line 162 and a second common electrode line 164. The first common electrode line 162 is located between the second common electrode line 164 and the corresponding transversal signal line 120. The shielding wire 152 is, for example, connected between the first common electrode line 162 and the second common electrode line 164. The shielding wire 154, for example, extends from the first common electrode line 162 toward the corresponding transversal signal line 120 without reaching the corresponding transversal signal line 120. In other words, the shielding wire 152 and the shielding wire 154, for example, extend from the first common electrode line 162 in opposite directions, and the shielding wire 154 is not connected to the transversal signal line 120, i.e., the shielding wire 154 and the transversal signal line 120 have a gap there between. As shown in FIG. 2B, the transversal signal line 120 and the shielding wire 154 are, for example, of the same film layer, and the first vertical signal line 132 and the second vertical signal line 134 are of the same film layer, and an insulating layer IN is disposed between the film layer of the transverse signal line 120 and the shielding wire 154 and the film layer of the first vertical signal line 132 and the second vertical signal line 134.

In the embodiment, the vertical signal line 130 further includes a third vertical signal line 136 and a fourth vertical signal line 138. The third vertical signal line 136 is located between the first vertical signal line 132 and the fourth vertical signal line 138. The pixel structure 140 is, for example, disposed between the second vertical signal line 134 and the fourth vertical signal line 138. The third vertical signal line 136 includes a transversal shift section 136A and a connection section 136B. The connection section 136B traverses the corresponding transversal signal line 120, and the transversal shift section 136A is further away from the fourth vertical signal line 138 relative to the connection section 136B. A distance S3 between the fourth vertical signal line 138 and the transversal shift section 136A is greater than a distance S4 between the fourth vertical signal line 138 and the connection section 136B. In addition, the distance S3 between the fourth vertical signal line 138 and the transversal shift section 136A may be substantially the same as the distance S1 between the second vertical signal line 134 and the transversal shift section 132A, so that the first vertical signal line 132 and the third vertical signal line 136 have a substantially symmetrical layout. However, in other embodiments, the distance S3 between the fourth vertical signal line 138 and the transversal shift section 136A may be selectively different from the distance S1 between the second vertical signal line 134 and the transversal shift section 132A. In some embodiments, the fourth vertical signal line 138 may be similar to the second vertical signal line 134 and is electrically connected to one of the transversal signal lines 120. In some other embodiments, the fourth vertical signal line 138 may be connected to a DC potential without being connected to any transversal signal line 120.

As required, the shielding wire 150 may optionally include a shielding wire 156 and a shielding wire 158 between the third vertical signal line 136 and the fourth vertical signal line 138, where a layout design of the shielding wire 156 is similar to that of the shielding wire 152, and a layout of the shielding wire 158 is similar to that of the shielding wire 154. In other words, the shielding wire 156 extends between the first common electrode line 162 and the second common electrode line 164, and the shielding wire 158 extends from the first common electrode line 162 toward the corresponding transversal signal line 120 without being connected to the transversal signal line 120. The shielding wire 156 is located between the transversal shift section 136A and the fourth vertical signal line 138, and the shielding wire 158 is located between the connection section 136B and the fourth vertical signal line 138. A distance S3A between the shielding wire 156 and the transversal shift section 136A and a distance S3B between the shielding wire 156 and the fourth vertical signal line 138 may be selectively the same or different. Both of the shielding wire 156 and the shielding wire 158 are connected to the common electrode line 160. The shielding wire 156 and the shielding wire 158 may mitigate the signal interference between the third vertical signal line 136 and the fourth vertical signal line 138 and help to ensure the display quality of the electronic device 100. However, in some embodiments, the electronic device 100 may omit the shielding wire 156 and the shielding wire 158.

Figure 3:
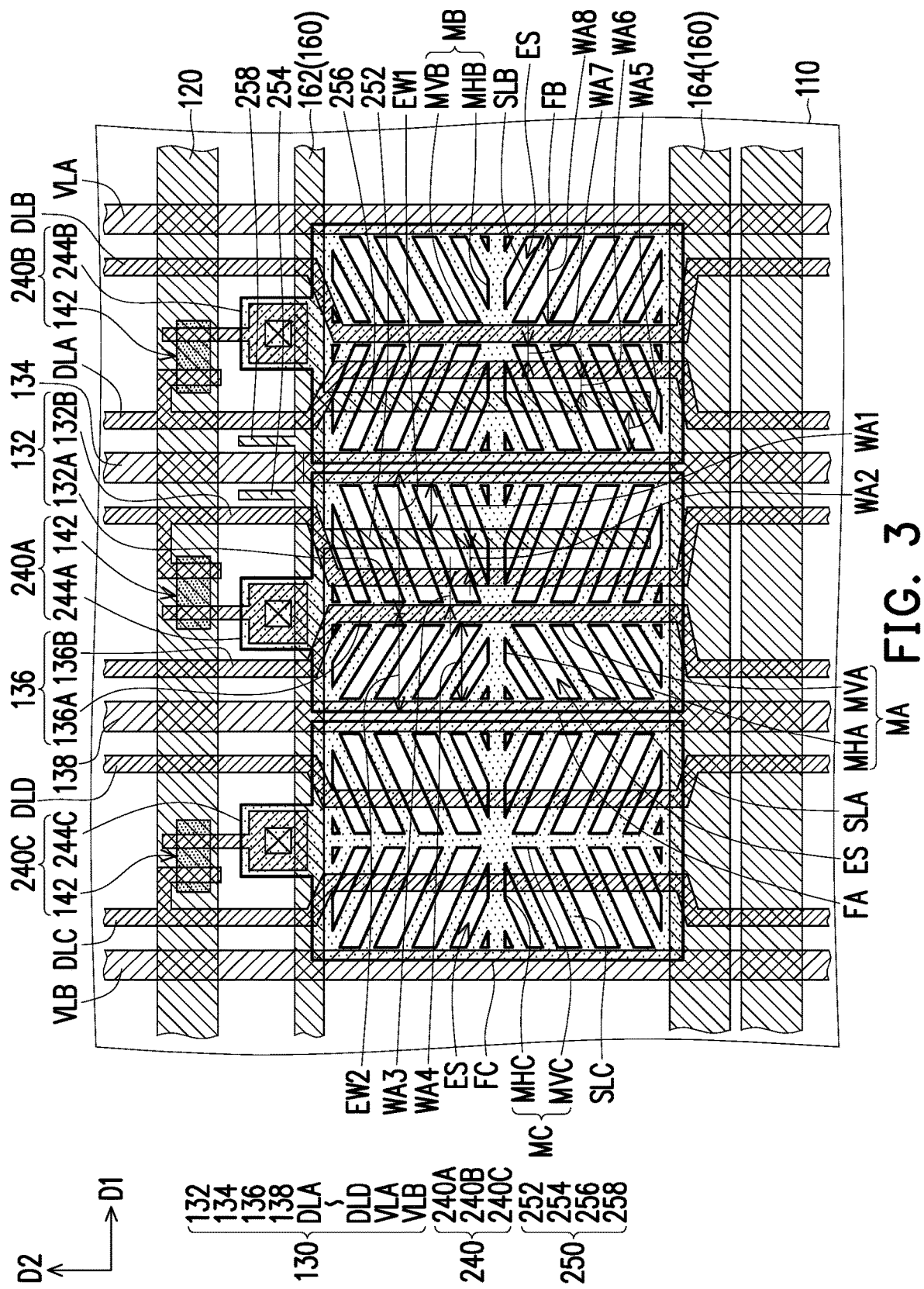
FIG. 3 is a partial schematic top view of an electronic device according to another embodiment of the disclosure.

FIG. 3 is a partial schematic top view of an electronic device according to another embodiment of the disclosure. In an electronic device 200 of FIG. 3, some of the components are the same as the aforementioned embodiments of FIG. 1 and FIG. 2, so that the same component symbols in these embodiments indicate the same components. The electronic device 200 includes the substrate 110, a plurality of the transversal signal lines 120, a plurality of the vertical signal lines 130, a plurality of pixel structures 240, a plurality of shielding wires 250, and the common electrode line 160. The transversal signal lines 120, the vertical signal lines 130, the pixel structures 240, the shielding wires 250, and the common electrode line 160 are all disposed on the substrate 110, and for layout designs of the substrate 110, the transversal signal lines 120, the vertical signal lines 130, and the common electrode line 160, reference may be made to the descriptions of the aforementioned embodiment, and details thereof are not repeated.

The pixel structures 240 include a pixel structure 240A, a pixel structure 240B and a pixel structure 240C, and the pixel structure 240A, the pixel structure 240B and the pixel structure 240C may have different structure designs. The pixel structure 240A includes an active device 142 and a pixel electrode 244A connected to the active device 142. The pixel electrode 244A includes a trunk portion MA and a plurality of oblique stripe portions SLA, where the oblique stripe portions SLA are connected to the trunk portion MA, and the oblique stripe portions SLA are separated by a plurality of slits ES. The trunk portion MA may include a vertical trunk portion MVA and a horizontal trunk portion MHA. The vertical trunk portion MVA and the horizontal trunk portion MHA are intersected to define four sub-regions, and the oblique stripe portions SLA configured in each sub-region are, for example, parallel to each other. The oblique stripe portions SLA may be directly connected to the vertical trunk portion MVA, the horizontal trunk portion MHA, or the both. In addition, the pixel electrode 244A may further include an outer frame portion FA, which surrounds the vertical trunk portion MVA, the horizontal trunk portion MHA, and the oblique stripe portions SLA in a frame-shaped pattern. A distance EW1 from a central axis of the vertical trunk portion MVA to an edge of the pixel electrode 244A extending in the first direction D1 is different from a distance EW2 from the central axis of the vertical trunk portion MVA to the other edge of the pixel electrode 244A extending in the first direction D1, but the disclosure is not limited thereto.

The pixel structures 240B includes the active device 142 and a pixel electrode 244B connected to the active device 142. The pixel electrode 244B includes a trunk portion MB and a plurality of oblique stripe portions SLB, where the oblique stripe portions SLB are connected to the trunk portion MB, and the oblique stripe portions SLB are separated by a plurality of the slits ES. The trunk portion MB may include a vertical trunk portion MVB and a horizontal trunk portion MHB. The oblique stripe portions SLB may be directly connected to the vertical trunk portion MVB, the horizontal trunk portion MHB, or the both. In addition, the pixel electrode 244B may further include an outer frame portion FB, which surrounds the vertical trunk portion MVB, the horizontal trunk portion MHB, and the oblique stripe portions SLB in the frame-shaped pattern.

The pixel structures 240C includes the active device 142 and a pixel electrode 244C connected to the active device 142. The pixel electrode 244C includes a trunk portion MC and a plurality of oblique stripe portions SLC, where the oblique stripe portions SLC are connected to the trunk portion MC, and the oblique stripe portions SLC are separated by a plurality of the slits ES. The trunk portion MC may include a vertical trunk portion MVC and a horizontal trunk portion MHC. The oblique stripe portions SLC may be directly connected to the vertical trunk portion MVC, the horizontal trunk portion MHC, or the both. In addition, the pixel electrode 244C may further include an outer frame portion FC, which surrounds the vertical trunk portion MVC, the horizontal trunk portion MHC, and the oblique stripe portions SLC in the frame-shaped pattern.

The vertical signal lines 130 may be disposed corresponding to the pixel structures 240. For example, the vertical signal lines 130 may include the first vertical signal line 132, the second vertical signal line 134, the third vertical signal line 136, and the fourth vertical signal line 138 corresponding to the pixel structure 240A. The first vertical signal line 132 and the third vertical signal line 136 traverse the pixel structure 240A and are overlapped with the pixel electrode 244A of the pixel structure 240A. The second vertical signal line 134 is located between the pixel structure 240A and the pixel structure 240B, and the fourth vertical signal line 138 is located between the pixel structure 240A and the pixel structure 240C. In other words, the first vertical signal line 132 and the third vertical signal line 136 are located between the second vertical signal line 134 and the fourth vertical signal line 138. In some embodiments, the pixel structure 240A and the pixel structure 240B located at two sides of the second vertical signal line 134 may be respectively a red pixel structure and a blue pixel structure, or otherwise, and the pixel structure 240C may be a green pixel structure, but the disclosure is not limited thereto.

Moreover, the vertical signal lines 130 may further include vertical signal lines DLA, DLB and VLA corresponding to the pixel structure 240B and vertical signal lines DLC, DLD and VLB corresponding to the pixel structure 240C. The vertical signal lines DLA and DLB are overlapped with the pixel electrode 244B of the pixel structure 240B, and the vertical signal lines DLC and DLD are overlapped with the pixel electrode 244C of the pixel structure 240C. Meanwhile, the vertical signal lines DLA and DLB are located between the second vertical signal line 134 and the vertical signal line VLA, and the vertical signal lines DLC and DLD are located between the fourth vertical signal line 138 and the vertical signal line VLB.

The pixel structure 240A may be electrically connected to the first vertical signal line 132, and another pixel structure (not shown) arranged in a same vertical direction (the second direction D2) as the pixel structure 240A is electrically connected to the third vertical signal line 136. The pixel structure 240B may be electrically connected to the vertical signal line DLA, and another pixel structure (not shown) arranged in the same vertical direction (the second direction D2) as the pixel structure 240B is electrically connected to the vertical signal line DLB. The pixel structure 240C may be electrically connected to the vertical signal line DLC, and another pixel structure (not shown) arranged in the same vertical direction (the second direction D2) as the pixel structure 240C is electrically connected to the vertical signal line DLD.

In the embodiment, the signals transmitted by the first vertical signal line 132, the third vertical signal line 136, and the vertical signal lines DLA-DLD are data signals provided to the pixel structures 240, and the signal transmitted by the second vertical signal line 134 is, for example, a gate signal provided to one of the transversal signal lines 120. The signal on the second vertical signal line 134 is a pulse signal, which may interfere with the signals on the adjacent vertical signal lines 130 (for example, the first vertical signal line 132 and the vertical signal line DLA). Therefore, the shielding wires 250 in the electronic device 200 includes a shielding wire 252 and a shielding wire 254 located between the second vertical signal line 134 and the first vertical signal line 132; and the shielding wire 256 and the shielding wire 258 located between the second vertical signal line 134 and the vertical signal line DLA.

The shielding wire 252 and the shielding wire 254 extend from the first common electrode line 162 of the common electrode line 160 in opposite directions without overlapping with any transversal signal line 120, and similarly, the shielding wire 256 and the shielding wire 258 extend from the first common electrode line 162 of the common electrode line 160 in the opposite directions without overlapping with any transversal signal line 120. Moreover, there is no shielding wire between the fourth vertical signal line 138 and the adjacent pixel structure 240, but the disclosure is not limited thereto. In FIG. 3, the shielding wire 252 and the shielding wire 256 are not connected to the second common electrode line 164 of the common electrode line 160, but the disclosure is not limited thereto. In other embodiments, the shielding wire 252 and the shielding wire 256 may be selectively connected to the second common electrode line 164 of the common electrode line 160.

The fourth vertical signal line 138 is, for example, connected to a DC potential. In this way, the signal of the fourth vertical signal line 138 does not significantly interfere with the signals of the adjacent vertical signal lines 130 (such as the third vertical signal line 136 and the vertical signal line DLD). Therefore, the electronic device 200 may not design a shielding wire between the fourth vertical signal line 138 and the third vertical signal line 136, or may not design a shielding wire between the fourth vertical signal line 138 and the vertical signal line DLD.

In the embodiment, the vertical signal lines 130 used for transmitting the data signals may have a bending structure. For example, the first vertical signal line 132 may include the transversal shift section 132A and the connection section 132B. The connection section 132B is connected to the transversal shift section 132A and traverses the transversal signal line 120. A distance between the connection section 132B and the second vertical signal line 134 is less than a distance between the transversal shift section 132A and the second vertical signal line 134. Moreover, orthogonal projections of the transversal shift section 132A and the shielding wire 252 on the substrate 110 are all located between an orthogonal projection of the second vertical signal line 134 on the substrate 110 and an orthogonal projection of the vertical trunk portion MVA on the substrate 110.

The third vertical signal line 136 includes a transversal shift section 136A and a connection section 136B. A distance between the connection section 136B and the fourth vertical signal line 138 is less than a distance between the transversal shift section 136A and the fourth vertical signal line 138. In some embodiments, the shielding wire 252, the transversal shift section 132A and the transversal shift section 136A may be made of a metal material to prevent light transmission, so that a portion of the pixel electrode 244A that is shielded by the shielding wire 252, the transversal shift section 132A and the transversal shift section 136A may not provide a display effect, but the disclosure is not limited thereto. In this way, a width of the pixel electrode 244A may be divided into a first width WA1, a second width WA2, a third width WA3 and a fourth width WA4 that are sequentially arranged from the second vertical signal line 134 toward the fourth vertical signal line 138 by the shielding wire 252, the transversal shift section 132A and the transversal shift section 136A. Moreover, an orthogonal projection of the transversal shift section 136A on the substrate 110 is substantially overlapped with an orthogonal projection of the vertical trunk portion MVA of the pixel electrode 244A on the substrate 110. In this case, regions of the first width WA1, the second width WA2, and the third width WA3 and a region of the fourth width WA4 are, for example, located on two opposite sides of the vertical trunk portion MVA. In some embodiments, a sum of the first width WA1, the second width WA2, and the third width WA3 (for example, WA1+WA2+WA3) may be 0.8 to 1.2 times of the fourth width WA4. In this way, the pixel electrode 244A has substantially closed display areas on the two opposite sides of the vertical trunk portion MVA, which helps to provide a closed or substantially the same display brightness at different viewing angles.

In the pixel structure 240B, the pixel electrode 244B and the pixel electrode 244A may present a symmetric relationship in structure design, and a configuration relationship of the vertical signal line DLA, the vertical signal line DLB and the shielding wire 256 relative to the second vertical signal line 134 may be symmetric to a configuration relationship of the first vertical signal line 132, the third vertical signal line 136 and the shielding wire 252 relative to the second vertical signal line 134. For example, an orthogonal projection of the vertical signal line DLB on the substrate 110 may be overlapped with an orthogonal projection of the vertical trunk portion MVB of the pixel electrode 244B on the substrate 110. Orthogonal projections of the vertical signal line DLA and the shielding wire 256 on the substrate 110 are between the orthogonal projection of the second vertical signal line 134 on the substrate 110 and the orthogonal projection of the vertical signal line DLB on the substrate 110. The vertical signal line DLA, the vertical signal line DLB, and the shielding wire 256 may divide a width of the pixel electrode 244B into a fifth width WA5, a sixth width WA6, a seventh width WA7 and an eighth width WA8 that are sequentially arranged from the second vertical signal line 134 toward the vertical signal line VLA. Regions of the fifth width WA5, the sixth width WA6, and the seventh width WA7 and a region of the eighth width WA8 are located on two opposite sides of the vertical trunk portion MVB, and a sum of the fifth width WA5, the sixth width WA6, and the seventh width WA7 (for example, WA5+WA6+WA7) may be 0.8 to 1.2 times of the eighth width WA8. In this way, the pixel structure 240B may provide a closed or substantially the same display brightness at different viewing angles.

The electronic device 200 does not provide a shielding wire at the pixel structure 240C. In the pixel structure 240C, the vertical trunk portion MVC may be disposed at a center line of the pixel electrode 244C, and an orthogonal projection of the vertical signal line DLD on the substrate 110 is located between an orthogonal projection of the vertical trunk portion MVC on the substrate 110 and an orthogonal projection of the fourth vertical signal line 138 on the substrate 110, and an orthogonal projection of the vertical signal line DLC on the substrate 110 is located between the orthogonal projection of the vertical trunk portion MVC on the substrate 110 and an orthogonal projection of the vertical signal line VLB on the substrate 110. Moreover, the vertical signal line DLC and the vertical signal line DLD may be respectively a bending signal line, and the two vertical signal lines DLC and DLD have a symmetrical relationship, but the disclosure is not limited thereto. In the embodiment, the component structures on the two sides of the second vertical signal line 134 are substantially symmetric to each other, but the component structures on the two sides of the fourth vertical signal line 138 are different, but the disclosure is not limited thereto. In other embodiments, the layout design of the pixel structure 240C and the corresponding vertical signal lines DLC and DLD may be used to replace the pixel structure 240B and the corresponding vertical signal lines DLA and DLB. Namely, the shielding wire 256 may be selectively omitted.

Figure 4A:
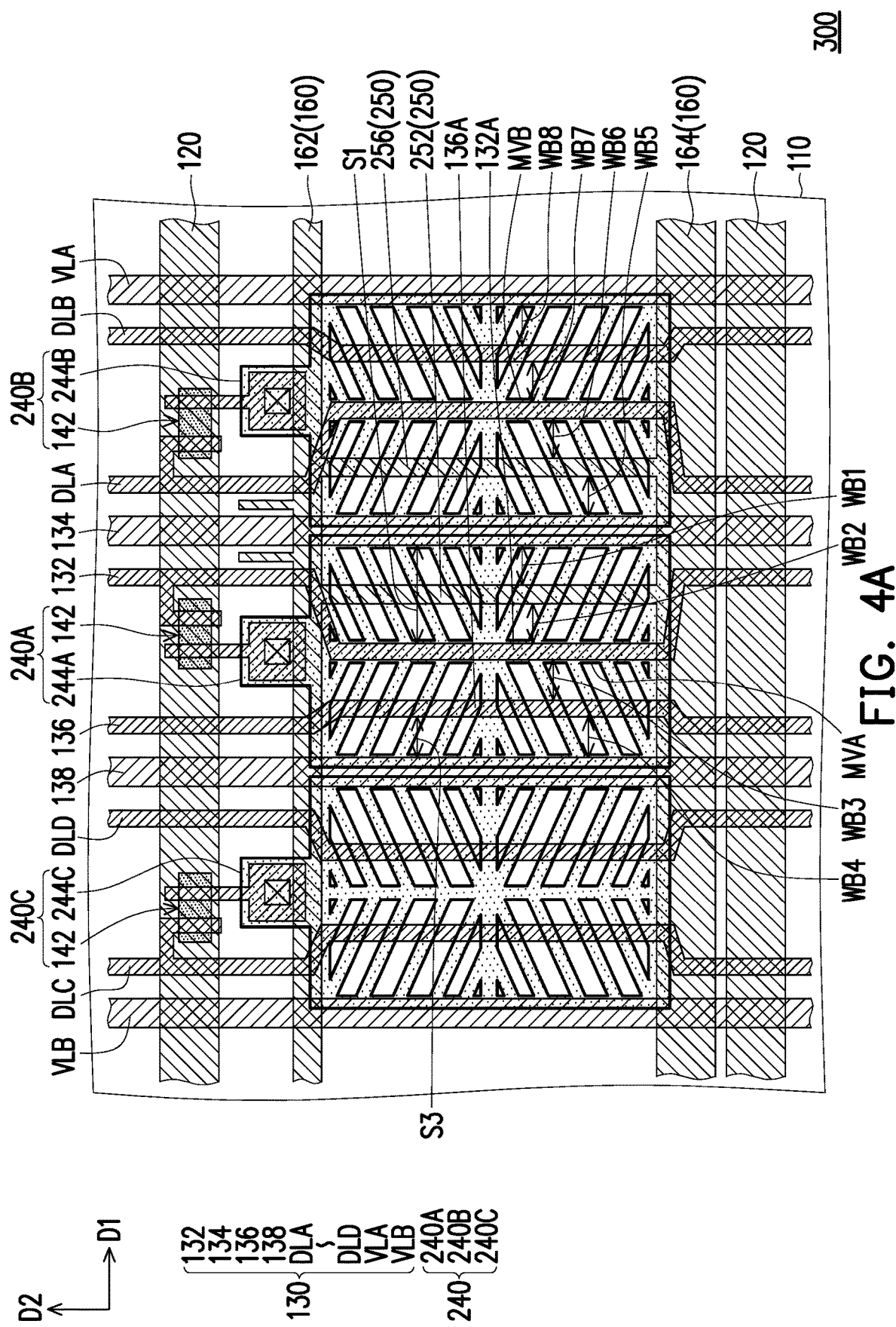
FIG. 4A is a partial schematic top view of an electronic device according to another embodiment of the disclosure.

FIG. 4A is a partial schematic top view of an electronic device according to another embodiment of the disclosure. In FIG. 4A, components of an electronic device 300 are substantially the same as those of the electronic device 200, so that the same component symbols are used to denote the same components in the two embodiments. To be specific, the electronic device 300 includes the substrate 110, a plurality of the transversal signal lines 120, a plurality of the vertical signal lines 130, a plurality of the pixel structures 240, a plurality of the shielding wires 250 and the common electrode line 160. The structures and relative configuration relationship of the transversal signal lines 120, the vertical signal lines 130, the pixel structures 240, the shielding wires 250, and the common electrode line 160 are similar to that of the aforementioned embodiment, and details thereof are not repeated. In the embodiment, the pixel structures 240A, 240B and 240C in the pixel structures 240 have different structures. The pixel structure 240A includes the active device 142 and the pixel electrode 244A, the pixel structure 240B includes the active device 142 and the pixel electrode 244B, and the pixel structure 240C includes the active device 142 and the pixel electrode 244C, where the arrangement of the pixel electrode 244A and the pixel electrode 244B relative to the vertical signal lines 130 is different from the embodiment of FIG. 3, and the arrangement of the pixel electrode 244C relative to the vertical signal lines 130 is the same as the embodiment of FIG. 3. In the embodiment, two ends of the shielding wire 252 and the shielding wire 256 of the shielding wires 250 are respectively connected to the first common electrode line 162 and the second common electrode line 164 of the common electrode line 160, but the disclosure is not limited thereto. In some embodiments, the shielding wire 252 and the shielding wire 256 may not be connected to the second common electrode line 164 and have the same configuration as the shielding wire 252 and the shielding wire 256 of FIG. 3.

In FIG. 4A, the vertical trunk portion MVA of the pixel electrode 244A is substantially located at a center line of the pixel electrode 244A, and the transversal shift section 132A of the first vertical signal line 132 is overlapped with the vertical trunk portion MVA of the pixel electrode 244A. In some embodiments, the distance S3 between the transversal shift section 136A of the third vertical signal line 136 and the fourth vertical signal line 138 is less than the distance S1 between the transversal shift section 132A of the first vertical signal line 132 and the second vertical signal line 134. The shielding wire 252 is located between the second vertical signal line 134 and the vertical trunk portion MVA of the pixel electrode 244A, and the transversal shift section 136A of the third vertical signal line 136 is located between the fourth vertical signal line 136 and the vertical trunk portion MVA of the pixel electrode 244A. In this way, the shielding wire 252, the first vertical signal line 132 overlapped with the vertical trunk portion MVA and the third vertical signal line 136 divide a width of the pixel electrode 244A into a first width WB1, a second width WB2, a third width WB3, and a fourth width WB4 sequentially arranged from the second vertical signal line 134 toward the fourth vertical signal line 138. In some embodiments, a sum of the first width WB1 and the second width WB2 (for example, WB1+WB2) may be 0.8 to 1.2 times of a sum of the third width WB3 and the fourth width WB4 (for example, WB3+WB4). In this way, the pixel electrode 244A has substantially closed display areas on two opposite sides of the vertical trunk portion MVA, which helps to provide closed or substantially the same display brightness at different viewing angles. In some embodiments, the distance WB3 between the transversal shift section 136A of the third vertical signal line 136 and the transversal shift section 132A of the first vertical signal line 132 may be equal to the distance WB2 between the shielding wire 252 and the transversal shift section 132A of the first vertical signal line 132, so that the second width WB2 and the third width WB3 may be substantially the same. In some embodiments, the first width WB1 and the second width WB2 are selectively substantially the same. In some embodiments, the third width WB3 and the fourth width WB4 are selectively substantially the same. In some embodiments, the first width WB1, the second width WB2, the third width WB3, and the fourth width WB4 are selectively substantially the same with each other.

Moreover, in the pixel structure 240B, the vertical signal line DLA is overlapped with the vertical trunk portion MVB of the pixel electrode 244B. The shielding wire 256 is located between the second vertical signal line 134 and the vertical trunk portion MVB of the pixel electrode 244B, and the third vertical signal line DLB is located between the vertical signal line VLA and the vertical trunk portion MVB of the pixel electrode 244B. The shielding wire 256, the vertical signal line DLA overlapped with the vertical trunk portion MVB and the vertical signal line DLB divide a width of the pixel electrode 244B into a fifth width WB5, a sixth width WB6, a seventh width WB7 and an eighth width WB8 sequentially arranged from the second vertical signal line 134 toward the vertical signal line VLA. In some embodiments, a sum of the fifth width WB5 and the sixth width WB6 (for example, WB5+WB6) may be 0.8 to 1.2 times of a sum of the seventh width WB7 and the eighth width WB8 (for example, WB7+WB8). In this way, the pixel electrode 244B may provide closed or substantially the same display brightness at different viewing angles. In the embodiment, structure designs on the two sides of the second vertical signal line 134 are substantially symmetrical to each other, but the disclosure is not limited thereto. In other embodiments, a layout design of the pixel structure 240C and the corresponding vertical signal lines DLC and DLD may be used to replace the pixel structure 240B and the corresponding vertical signal lines DLA and DLB. Namely, the shielding wire 256 may be selectively omitted.

Figure 4B:
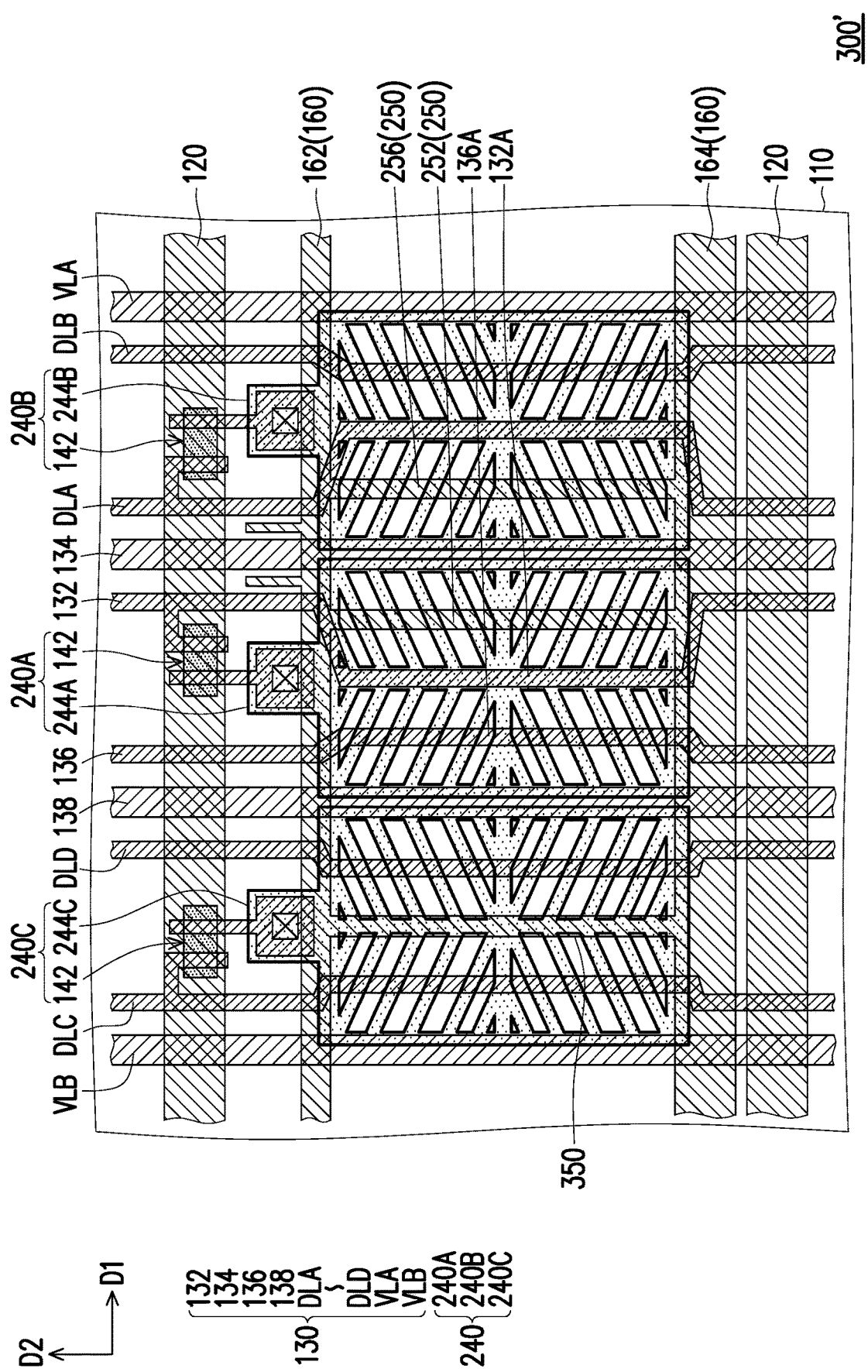
FIG. 4B is a partial schematic top view of an electronic device according to another embodiment of the disclosure.

FIG. 4B is a partial schematic top view of an electronic device according to another embodiment of the disclosure. In FIG. 4B, components of an electronic device 300' are substantially the same as those of the electronic device 200, so that the same component symbols are used to denote the same components in the two embodiments. To be specific, the electronic device 300' includes the substrate 110, a plurality of the transversal signal lines 120, a plurality of the vertical signal lines 130, a plurality of the pixel structures 240, a plurality of the shielding wires 250 and the common electrode line 160. The vertical signal lines 130 include vertical signal lines DLA-DLD, vertical signal lines VLA and VLB, the first vertical signal line 132, the second vertical signal line 134, the third vertical signal line 136, and the fourth vertical signal line 138. The pixel structures 240 include the pixel structures 240A, 240B and 240C. The shielding wires 250 include the shielding wire 252 and the shielding wire 256. The common electrode line 160 includes the first common electrode line 162 and the second common electrode line 164. The structures and relative configuration relationship of the transversal signal lines 120, the vertical signal lines 130, the pixel structures 240, the shielding wires 250, and the common electrode line 160 are similar to that of the embodiment of FIG. 4A, and details thereof are not repeated. In the embodiment, the pixel structures 240A, 240B and 240C in the pixel structures 240 have different structures, and the electronic device 300' further includes another shielding wire 350, where the shielding wire 350 is disposed under the pixel structure 240C and overlapped with the pixel electrode 244C of the pixel structure 240C. In this way, the shielding wire 350, the vertical signal line DLC and the vertical signal line DLD may divide an area of the pixel electrode 244C between the fourth vertical signal line 138 and the other vertical signal line VLB into four regions, and widths of the four regions measured in the first direction D1 may be substantially the same. In other words, a distance from the fourth vertical signal line 138 to the vertical signal line DLD, a distance from the vertical signal line DLD to the shielding wire 350, a distance from the shielding wire 350 to the vertical signal line DLC, and a distance from the vertical signal line DLC to the other vertical signal line VLB may be substantially the same, but the disclosure is not limited thereto. In this way, the pixel structure 240A, the pixel structure 240B, the pixel structure 240C, and the pixel structure 240D are respectively divided into four regions by the vertical lines to achieve a uniform layout structure.

FIG. 5A is a partial schematic top view of an electronic device according to another embodiment of the disclosure. In FIG. 5A, components of an electronic device 400 are substantially the same as those of the electronic device 200, so that the same component symbols are used to denote the same components in the two embodiments. To be specific, the electronic device 400 includes the substrate 110, a plurality of the transversal signal lines 120, a plurality of the vertical signal lines 130, a plurality of the pixel structures 240, a plurality of the shielding wires 250 and the common electrode line 160. The structures and relative configuration relationship of the transversal signal lines 120, the vertical signal lines 130, the pixel structures 240, the shielding wires 250, and the common electrode line 160 are similar to that of the aforementioned embodiment, and details thereof are not repeated.

In the embodiment, two ends of the shielding wire 252 and the shielding wire 256 of the shielding wires 250 are respectively connected to the first common electrode line 162 and the second common electrode line 164 of the common electrode line 160, but the disclosure is not limited thereto. In some embodiments, the shielding wire 252 and the shielding wire 256 may not be connected to the second common electrode line 164 and have the same configuration as the shielding wire 252 and the shielding wire 256 of FIG. 3. In the embodiment, the pixel structures 240A, 240B, and 240C in the pixel structures 240 have different structures, where a structure design and a configuration of the pixel structure 240C are the same as that in the embodiment of FIG. 3. However, structure designs of a pixel electrode 444A of the pixel structure 240A and a pixel electrode 444B of the pixel structure 240B are different from that of the embodiment of FIG. 3.

The pixel electrode 444A of the pixel structure 240A includes a first sub-electrode SEA1 and a second sub-electrode SEA2, and the first sub-electrode SEA1 is located between the second sub-electrode SEA2 and the second vertical signal line 134. The first sub-electrode SEA1 includes a first vertical trunk portion SMV1 and a plurality of first oblique stripe portions SSL1, and the first oblique stripe portions SSL1 are connected to the first vertical trunk portion SMV1. In some embodiments, the first vertical trunk portion SMV1 may be disposed at a center line of the first sub-electrode SEA1. The second sub-electrode SEA2 includes a second vertical trunk portion SMV2 and a plurality of second oblique stripe portions SSL2, where the second oblique stripe portions SSL2 are connected to the second vertical trunk portion SMV2. In some embodiments, the second vertical trunk portion SMV2 may be disposed at a center line of the second sub-electrode SEA2. The first sub-electrode SEA1 and the second sub-electrode SEA2 have substantially the same structure, but the disclosure is not limited thereto.

In FIG. 5A, the transversal shift section 132A of the first vertical signal line 132 is located between the first sub-electrode SEA1 and the second sub-electrode SEA2. Namely, the orthogonal projection of the first vertical signal line 132 on the substrate 110 is located between an orthogonal projection of the first sub-electrode SEA1 on the substrate 110 and an orthogonal projection of the second sub-electrode SEA2 on the substrate 110. Moreover, the shielding wire 252 is overlapped with the first vertical trunk portion SMV1, and the third vertical signal line 136 is overlapped with the second vertical trunk SMV2. In some embodiments, the shielding wire 252 may be located at the center line of the first sub-electrode SEA1, and the portion where the third vertical signal line 136 is overlapped with the pixel electrode 444A may be located at the center line of the second sub-electrode SEA1, but the disclosure is not limited thereto.

The pixel electrode 444B may include a first sub-electrode SEB1 and a second sub-electrode SEB2, where the first sub-electrode SEB1 and the second sub-electrode SEB2 respectively include a vertical trunk portion and a plurality of oblique stripe portions. The shielding wire 256 is overlapped with the vertical trunk portion of the first sub-electrode SEB1, and the vertical signal line DLB is overlapped with the vertical trunk portion of the second sub-electrode SEB2. Moreover, the vertical signal line DLA is located between the first sub-electrode SEB1 and the second sub-electrode SEB2. The pixel electrode 444B of the pixel structure 240B may be symmetrically designed with respect to the pixel electrode 444A of the pixel structure 240A, but the disclosure is not limited thereto. In other embodiments, the pixel structure 240B may have a design similar to that of the pixel structure 240C, and the electronic device 400 may omit the shielding wire 256.

Figure 5B:
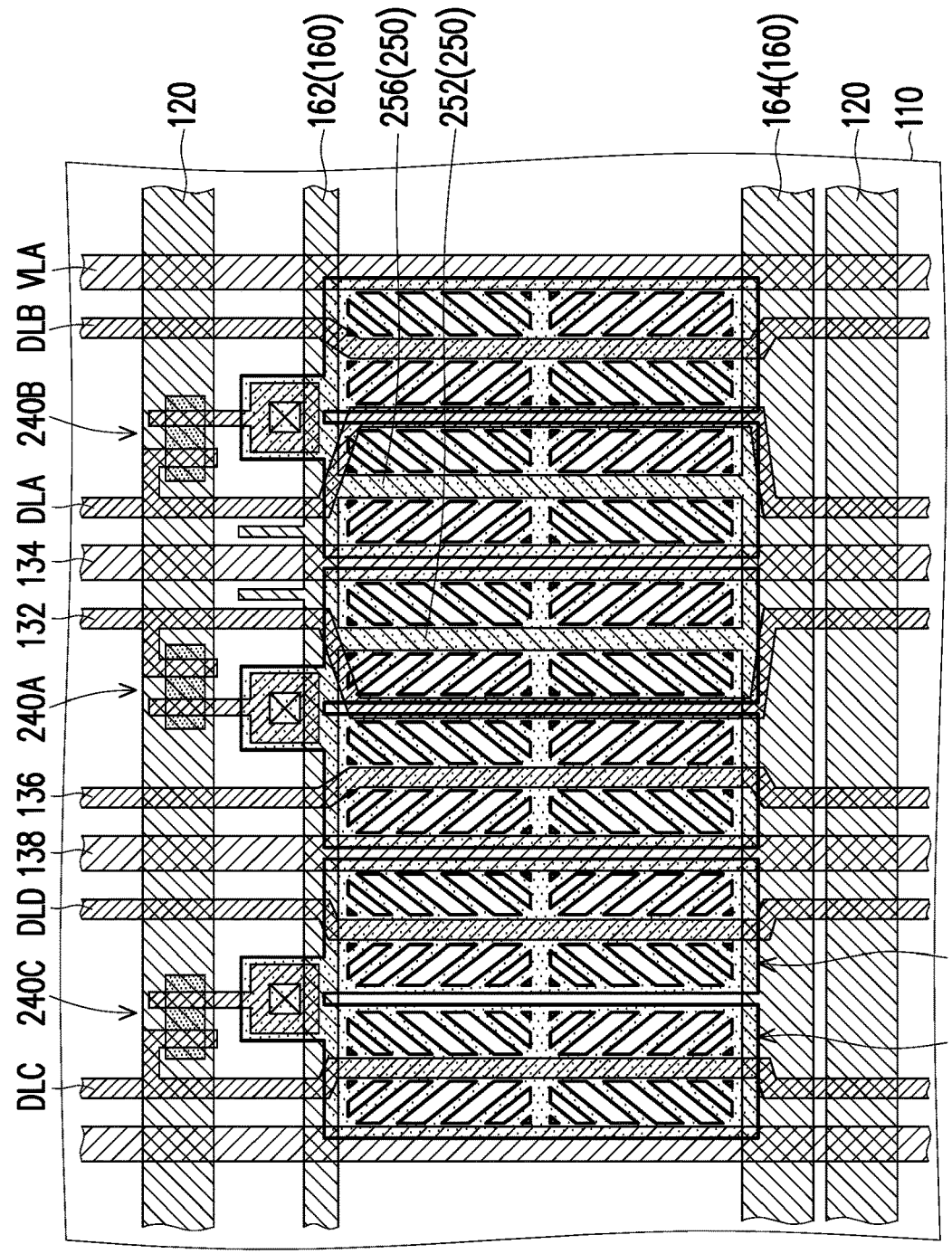
FIG. 5B is a partial schematic top view of an electronic device according to another embodiment of the disclosure.

FIG. 5B is a partial schematic top view of an electronic device according to another embodiment of the disclosure. In FIG. 5B, components of an electronic device 400' are substantially the same as those of the electronic device 400 of FIG. 5A, so that the same component symbols are used to denote the same components in the two embodiments. To be specific, the electronic device 400' includes the substrate 110, a plurality of the transversal signal lines 120, a plurality of the vertical signal lines 130, a plurality of the pixel structures 240, a plurality of the shielding wires 250 and the common electrode line 160. The vertical signal lines 130 include vertical signal lines DLA-DLD, the vertical signal line VLA, the first vertical signal line 132, the second vertical signal line 134, the third vertical signal line 136, and the fourth vertical signal line 138. The pixel structures 240 include the pixel structures 240A, 240B and 240C. The shielding wires 250 include the shielding wire 252 and the shielding wire 256. The common electrode line 160 includes the first common electrode line 162 and the second common electrode line 164. The structures and relative configuration relationship of the transversal signal lines 120, the vertical signal lines 130, the pixel structures 240, the shielding wires 250, and the common electrode line 160 are similar to that of the aforementioned embodiment, and details thereof are not repeated. A main difference between the embodiment and the embodiment of FIG. 4A is that in the electronic device 400', the pixel electrode 444C of the pixel structure 240C includes a first sub-electrode SEC1 and a second sub-electrode SEC2, and the first sub-electrode SEC1 is located between the second sub-electrode SEC2 and the fourth vertical signal line 138. In other words, in the electronic device 400', the pixel structure 240A, the pixel structure 240B, and the pixel structure 240C all have substantially the same pixel electrode pattern design. In some embodiments, the vertical signal line DLC and the vertical signal line DLD may be respectively located on center lines of the second sub-electrode SEC2 and the first sub-electrode SEC1, but the disclosure is not limited thereto.

Figure 6:
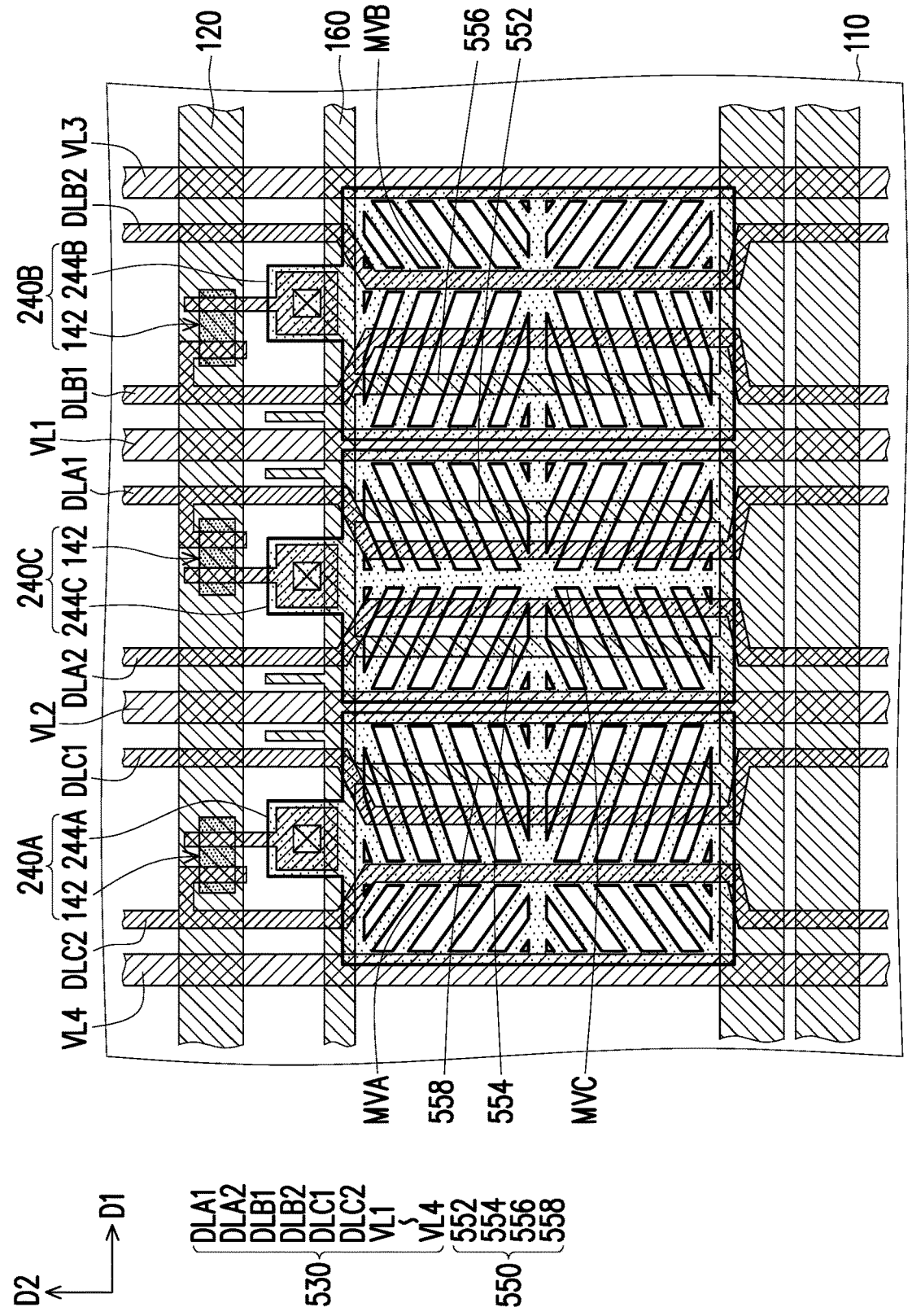
FIG. 6 is a partial schematic top view of an electronic device according to another embodiment of the disclosure.

FIG. 6 is a partial schematic top view of an electronic device according to another embodiment of the disclosure.

In an electronic device 500 of FIG. 6, some components are the same as the components in the aforementioned embodiments of FIG. 1 and FIG. 2, so that the same component symbols are used to denote the same components in these embodiments. The electronic device 500 includes the substrate 110, a plurality of the transversal signal lines 120, a plurality of vertical signal lines 530, a plurality of the pixel structures 240, a plurality of shielding wires 550, and the common electrode line 160. The transversal signal lines 120, the vertical signal lines 530, the pixel structures 240, the shielding wires 550, and the common electrode line 160 are all disposed on the substrate 110, and for layout designs of the substrate 110, the transversal signal lines 120, the pixel structure 240, and the common electrode line 160, reference may be made to the descriptions of the aforementioned embodiments, which are not repeated.

In the embodiment, the vertical signal line 530 includes vertical signal lines DLA1, DLA2, DLB1, DLB2, DLC1 and DLC2 used for transmitting data signals, and vertical signal lines VL1 and VL2 used for transmitting signals of the transversal signal lines 120, and vertical signal lines VL3 and VL4 connected to a DC potential. The vertical signal lines DLA1 and DLA2 are disposed between the vertical signal lines VL1 and VL2, the vertical signal lines DLB1 and DLB2 are disposed between the vertical signal lines VL1 and VL3, and the vertical signal lines DLC1 and DLC2 are disposed between the vertical signal lines VL2 and VL4. In addition, the vertical signal lines VL1 and VL2 are disposed between the vertical signal lines VL3 and VL4, the vertical signal line VL1 is disposed between the vertical signal lines VL2 and VL3, and the vertical signal line VL2 is disposed between the vertical signal lines VL1 and VL4.

The pixel structures 240 include a pixel structure 240A, a pixel structure 240B, and a pixel structure 240C with different structure designs. The pixel structure 240C is located between the vertical signal lines VL1 and VL2, and the vertical signal lines DLA1 and DLA2 are overlapped with the pixel structure 240C. Signals transmitted by the vertical signal lines DLA1 and DLA2 are provided to the pixel structure 240C and other pixel structures (not shown) disposed between the vertical signal lines VL1 and VL2. The pixel structure 240B is located between the vertical signal lines VL1 and VL3, and the vertical signal lines DLB1 and DLB2 are overlapped with the pixel structure 240B. Signals transmitted by the vertical signal lines DLB1 and DLB2 are provided to the pixel structure 240B and other pixel structures (not shown) disposed between the vertical signal lines VL1 and VL3. The pixel structure 240A is located between the vertical signal lines VL2 and VL4, and the vertical signal lines DLC1 and DLC2 are overlapped with the pixel structure 240A. Signals transmitted by the vertical signal lines DLC1 and DLC2 are provided to the pixel structure 240A and other pixel structures (not shown) disposed between the vertical signal lines VL2 and VL4.

The pixel structure 240C includes the active element 142 and the pixel electrode 244C, where for a detailed structure of the pixel electrode 244C, reference may be made to the related description of FIG. 3, which is not repeated. The pixel structure 240B includes the active element 142 and the pixel electrode 244B, where for a detailed structure of the pixel electrode 244B, reference may be made to the related description in FIG. 3, which is not repeated. The pixel structure 240A includes the active element 142 and the pixel electrode 244A, where for a detailed structure of the pixel electrode 244A, reference may be made to the related description in FIG. 3, which is not repeated.

In the embodiment, the vertical signal lines VL1 and VL2 are all used to transmit gate signals required by the transversal signal lines 120, and the vertical signal lines DLA1, DLA2, DLB1, and DLC1 are all used to transmit data signals to be input to the pixel structure 240. In order to reduce the mutual interference between the gate signal and the data signal, the electronic device 500 is provided with the shielding wires 550 to reduce the mutual interference between the signals. For the convenience of description, the shielding wires 550 are respectively indicated as a shielding wire 552, a shielding wire 554, a shielding wire 556, and a shielding wire 558 for description.

An orthogonal projection of the shielding wire 552 on the substrate 110 is located between an orthogonal projection of the vertical signal line DLA1 on the substrate 110 and an orthogonal projection of the vertical signal line VL1 on the substrate 110, where the vertical signal line DLA1 and the shielding wire 552 are all overlapped with the pixel electrode 244C. The orthogonal projection of the shielding wire 552 on the substrate 110 and the orthogonal projection of the vertical signal line DLA1 on the substrate 110 are located between an orthogonal projection of the vertical trunk portion MVC of the pixel electrode 244C on the substrate 110 and an orthogonal projection of the vertical signal line VL1 on the substrate 110.

An orthogonal projection of the shielding wire 554 on the substrate 110 is located between an orthogonal projection of the vertical signal line DLA2 on the substrate 110 and an orthogonal projection of the vertical signal line VL2 on the substrate 110, where the vertical signal line DLA2 and the shielding wire 554 are all overlapped with the pixel electrode 244C. The orthogonal projection of the shielding wire 554 on the substrate 110 and the orthogonal projection of the vertical signal line DLA2 on the substrate 110 are located between the orthogonal projection of the vertical trunk portion MVC of the pixel electrode 244C on the substrate 110 and an orthogonal projection of the vertical signal line VL1 on the substrate 110. In the embodiment, the vertical signal line DLA1, the shielding wire 552 and the vertical signal line VL1 are located on a first side of the vertical trunk portion MVC, and the vertical signal line DLA2, the shielding wire 554 and the vertical signal line VL2 are located on a second side of the vertical trunk portion MVC, where the first side is opposite to the second side.

In some embodiments, the vertical trunk portion MVC may be located on the center line of the pixel electrode 244C. The vertical signal line DLA1 and the vertical signal line DLA2 may be, for example, symmetrically distributed while taking the vertical trunk portion MVC as a center. The shielding wire 552 and the shielding wire 554 can be, for example, symmetrically distributed while taking the vertical trunk portion MVC as the center. The vertical signal line VL1 and the vertical signal line VL2 may be, for example, symmetrically distributed while taking the vertical trunk portion MVC as the center. However, the above description of the symmetrical distribution is only a possible implementation, and the disclosure is not limited thereto.

An orthogonal projection of the shielding wire 556 on the substrate 110 is located between an orthogonal projection of the vertical signal line DLB1 on the substrate 110 and the orthogonal projection of the vertical signal line VL1 on the substrate 110. Meanwhile, the orthogonal projection of the shielding wire 556 on the substrate 110 and the orthogonal projection of the vertical signal line DLB1 on the substrate 110 are all located in the orthogonal projection of the vertical trunk portion MVB of the pixel electrode 244B on the substrate 110 and the orthogonal projection of the vertical signal line VL1 on the substrate 110. An orthogonal projection of the vertical signal line DLB2 on the substrate 110 is overlapped with the orthogonal projection of the vertical trunk portion MVB of the pixel electrode 244B on the substrate 110.

In the embodiment, all of the signal lines are made of metal materials and have a light-shielding property, and there may be no shielding wire between the vertical signal lines DLB2 and the vertical signal lines VL3. Therefore, the shielding wire 556, the vertical signal line DLB1 and the vertical signal line DLB2 may divide the pixel electrode 244B into four parts capable of providing a display effect and sequentially arranged from the vertical signal line VL1 toward the vertical signal line VL3, where three parts are located between the vertical trunk portion MVB and the vertical signal line VL1, and the other part is located between the vertical trunk portion MVB and the vertical signal line VL3. In some embodiments, a sum of widths of the three displayable parts between the vertical trunk portion MVB and the vertical signal line VL1 may be closed to or substantially equal to a width of the single part located between the vertical trunk portion MVB and the vertical signal line VL3, so as to present a uniform display effect in various viewing angles.

An orthogonal projection of the shielding wire 558 on the substrate 110 is located between an orthogonal projection of the vertical signal line DLC1 on the substrate 110 and the orthogonal projection of the vertical signal line VL2 on the substrate 110. Meanwhile, the orthogonal projection of the shielding wire 558 on the substrate 110 and the orthogonal projection of the vertical signal line DLC1 on the substrate 110 are located between the orthogonal projection of the vertical trunk portion MVA of the pixel electrode 244A on the substrate 110 and the orthogonal projection of the vertical signal line VL2 on the substrate 110. The orthogonal projection of the vertical signal line DLC2 on the substrate 110 is overlapped with the orthogonal projection of the vertical trunk portion MVA of the pixel electrode 244A on the substrate 110.

Similar to the design of the pixel structure 240B, in the pixel structure 240A, the shielding wire 558, the vertical signal line DLC1 and the vertical signal line DLC2 may divide the pixel electrode 244A into four parts capable of providing a display effect and sequentially arranged from the vertical signal line VL2 toward the vertical signal line VL4, where three parts are located between the vertical trunk portion MVA and the vertical signal line VL2, and the other part is located between the vertical trunk portion MVA and the vertical signal line VL4. In some embodiment, a sum of widths of the three parts between the vertical trunk portion MVA and the vertical signal line VL2 may be closed to or substantially equal to a width of the single part located between the vertical trunk portion MVA and the vertical signal line VL4, so as to present a uniform display effect in various viewing angles.

Figure 7:
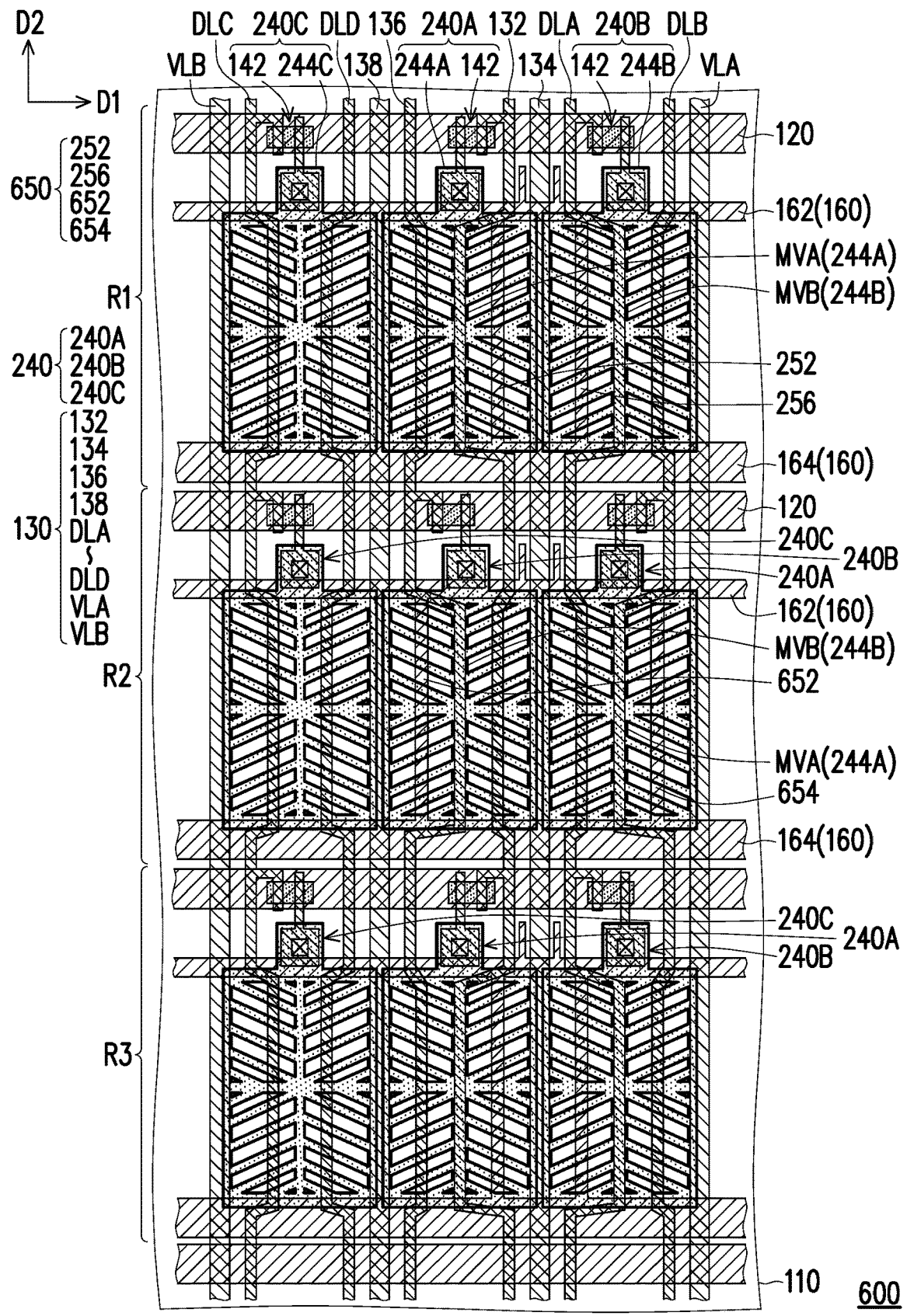
FIG. 7 is a partial schematic top view of an electronic device according to another embodiment of the disclosure.

FIG. 7 is a partial schematic top view of an electronic device according to another embodiment of the disclosure. In FIG. 7, components in an electronic device 600 are substantially the same as the components of the electronic device 200, so that the same component symbols are used to denote the same components in the two embodiments. To be specific, the electronic device 600 includes the substrate 110, a plurality of the transversal signal lines 120, a plurality of the vertical signal lines 130, a plurality of the pixel structures 240, a plurality of shielding wires 650, and a plurality of the common electrode lines 160. Detailed structures and relative configuration relationships of the components with the same referential numbers in the two embodiments are similar to those in the embodiment of FIG. 3, and details thereof are not repeated.

In the embodiment, the pixel structures 240 includes pixel structures 240A, 240B, and 240C with different structures, and the pixel structures 240 are arranged in an array along the first direction D1 and the second direction D2. To be specific, the three pixel structures 240 in a first row R1 include the pixel structure 240C, the pixel structure 240A, and the pixel structure 240B sequentially arranged from the vertical signal line VLB toward the vertical signal line VLA in the first direction D1. The three pixel structures 240 in a second row R2 include the pixel structure 240C, the pixel structure 240B, and the pixel structure 240A sequentially arranged from the vertical signal line VLB toward the vertical signal line VLA in the first direction D1. The three pixel structures 240 in a third row R3 include the pixel structure 240C, the pixel structure 240A, and the pixel structure 240B sequentially arranged from the vertical signal line VLB toward the vertical signal line VLA in the first direction D1.

In the embodiment, the pixel structure 240A and the pixel structure 240B are alternately arranged between the second vertical signal line 134 and the fourth vertical signal line 138 in the second direction D2. Between the second vertical signal line 134 and the fourth vertical signal line 138, besides the shielding wire 252, the shielding wires 650 also include a shielding wire 652, wherein the shielding wire 252 is overlapped with the pixel structure 240A of the first row R1, and the shielding wire 652 is overlapped with the pixel structure 240B of the second row R2. The shielding wire 252 is located between the first vertical signal line 132 and the second vertical signal line 134, but the shielding wire 652 is located between the third vertical signal line 136 and the fourth vertical signal line 138. Namely, the shielding wire 252 in the first row R1 and the shielding wire 652 in the second row R2 are not disposed between the first vertical signal line 132 and the second vertical signal line 134 at the same time, but are respectively disposed between the first vertical signal line 132 and the second vertical signal line 134 and between the third vertical signal line 136 and the fourth vertical signal line 138.

Similarly, the pixel structure 240B and the pixel structure 240A are alternately arranged between the second vertical signal line 134 and the vertical signal line VLA in the second direction D2. Between the second vertical signal line 134 and the vertical signal line VLA, besides the shielding wire 256, the shielding wires 650 also include a shielding wire 654, where the shielding wire 256 is overlapped with the pixel structure 240B of the first row R1, and the shielding wire 654 is overlapped with the pixel structure 240A of the second row R2. The shielding wire 256 is located between the second vertical signal line 134 and the vertical signal line DLA, but the shielding wire 654 is located between the vertical signal line DLB and the vertical signal line VLA. In other words, in the pixel structures 240 of different rows, the shielding wires 650 may be disposed between different sets of the vertical signal lines 130. The pixel structures 240 between the fourth vertical signal line 138 and the vertical signal line VLB may all be the pixel structure 240C.

In the embodiment, the first vertical signal line 132 is overlapped with the vertical trunk portion MVA of the pixel electrode 244A at the first row R1, and is located between the vertical trunk portion MVB of the pixel electrode 244B and the second vertical signal line 134 at the second row R2. The third vertical signal line 136 is located between the vertical trunk portion MVA of the pixel electrode 244A and the fourth vertical signal line 138 at the first row R1, and is overlapped with the vertical trunk portion MVB of the pixel electrode 244B at the second row R2. Meanwhile, between the second vertical signal line 134 and the fourth vertical signal line 138, the vertical trunk portion MVA of the pixel electrode 244A in the pixel structure 240A may be substantially aligned with the vertical trunk portion MVB of the pixel electrode 244B in the pixel structure 240B. In this way, a bending magnitude of the first vertical signal line 132 in the first row R1 is greater than that in the second row R2, and a bending magnitude of the third vertical signal line 136 in the first row R1 is less than that in the second row R2. In overall, a line length of the first vertical signal line 132 may be close to a line length of the third vertical signal line 136, thus having a close impedance, which helps to make the first vertical signal line 132 and the second vertical signal line 136 to have close transmission quality.

Similarly, bending magnitudes of the vertical signal line DLA and the vertical signal line DLB are alternately changed in the first row R1 and the second row R2. The vertical signal line DLA may be overlapped with the vertical trunk portion MVB of the pixel electrode 244B in the first row R1, and is located between the vertical trunk portion MVA of the pixel electrode 244A and the second vertical signal line 134 at the second row R2. Therefore, the bending magnitude of the vertical signal line DLA in the first row R1 is greater than that in the second row R2. The vertical signal line DLB may be located between the vertical trunk portion MVB of the pixel electrode 244B and the vertical signal line VLA at the first row R1, and is overlapped with the vertical trunk portion MVA of the pixel electrode 244A at the second row R1. Therefore, the bending magnitude of the vertical signal line DLB in the first row R1 is less than that in the second row R2. Under such design, a line length of the vertical signal line DLA may be close to a line length of the vertical signal line DLB, thereby achieving similar signal transmission properties and helping to ensure the performance of the electronic device 600.

Figure 8:
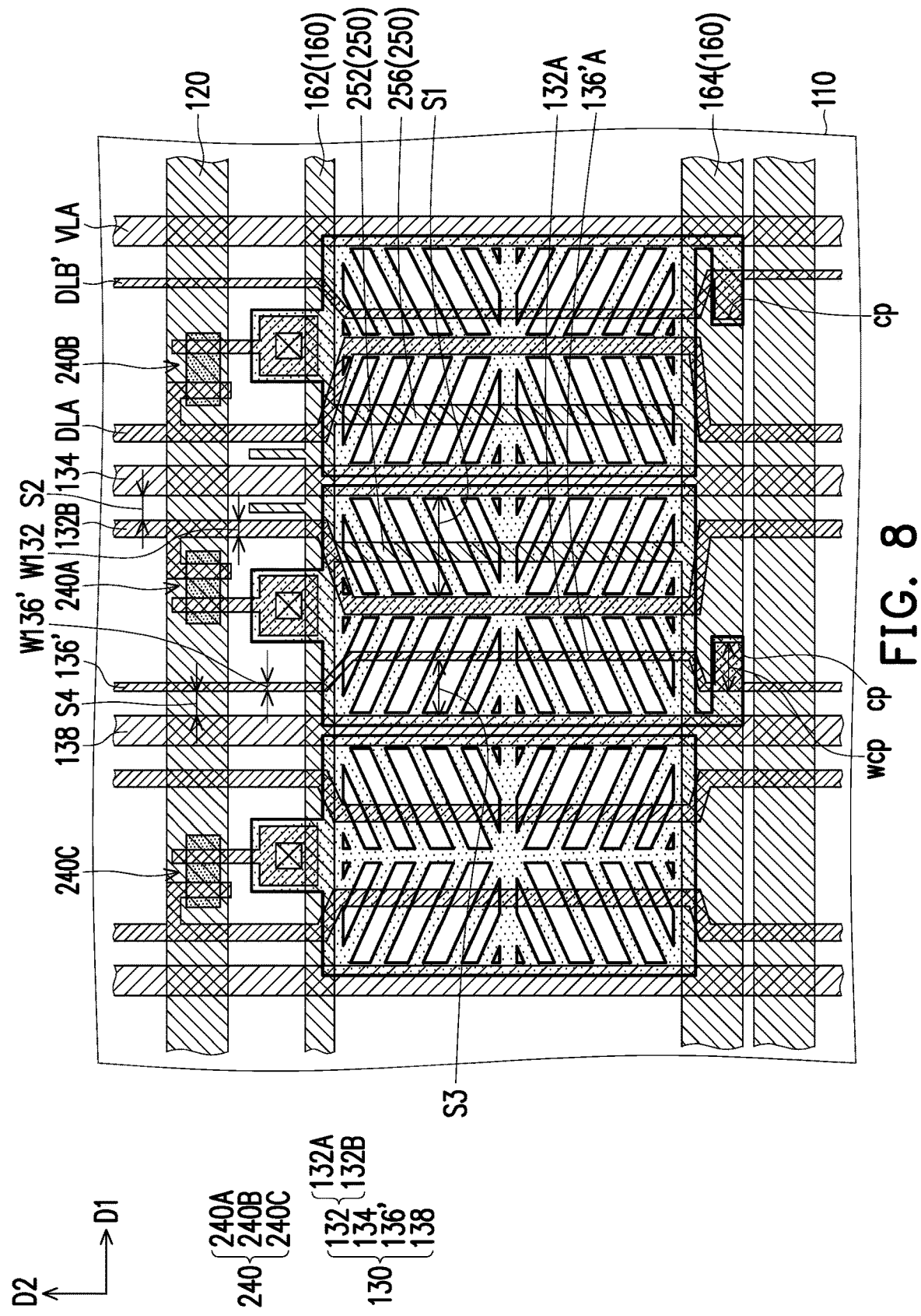
FIG. 8 is a partial schematic top view of an electronic device according to another embodiment of the disclosure.

FIG. 8 is a partial schematic top view of an electronic device according to another embodiment of the disclosure. In FIG. 8, components in an electronic device 700 are substantially the same as the components of the electronic device 300 of FIG. 4A, so that the same component symbols are used to denote the same components in the two embodiments. To be specific, the electronic device 700 includes the substrate 110, a plurality of the transversal signal lines 120, a plurality of the vertical signal lines 130, a plurality of the pixel structures 240 including the pixel structures 240A-240C, a plurality of the shielding wires 250 including the shielding wires 252 and 256, and a plurality of the common electrode lines 160 including the first common electrode line 162 and the second common electrode line 164. The structure design of the embodiment is substantially the same as that of the embodiment of FIG. 4A, so that detailed structures and relative configuration relationships of the components with the same referential numbers in the two embodiments are similar to those in the embodiment of FIG. 4A, and details thereof are not repeated. To be specific, a main difference between the present embodiment and the embodiment of FIG. 4A lies in a line width design of the vertical signal lines 130.

In the embodiment, the vertical signal lines 130 include the first vertical signal line 132, the second vertical signal line 134, a third vertical signal line 136', the fourth vertical signal line 138, and vertical signal lines DLA, DLB', VLA, etc. In the embodiment, a distance S1 between the transversal shift section 132A of the first vertical signal line 132 and the second vertical signal line 134 is greater than a distance S3 between a transversal shift section 136'A of the third vertical signal line 136' and the fourth vertical signal line 138. However, a distance S2 between the connection section 132B of the first vertical signal line 132 and the second vertical signal line 134 is substantially close to a distance S4 between a connection section 136'B of the third vertical signal line 136' and the fourth vertical signal line 138. Therefore, a bending degree of the first vertical signal line 132 is greater than that of the third vertical signal line 136', namely, a line length of the first vertical signal line 132 is greater than a line length of the third vertical signal line 136'. In the embodiment, a line width W136' of the third vertical signal line 136' may be less than a line width W132 of the first vertical signal line 132. In this way, an overall line length-width ratio of the first vertical signal line 132 and an overall line length-width ratio of the third vertical signal line 136' may be substantially close. In some embodiments, the overall line length to line width of the first vertical signal line 132 is a first ratio, and the overall line length to line width of the third vertical signal line 136' is a second ratio, and a ratio of the first ratio to the second ratio ranges from 0.8 to 1.2. Since the first vertical signal line 132 and the third vertical signal line 136' have a similar line length-width ratio, the two signal lines may have close impedances to provide a substantially uniform signal transmission property.

Moreover, the third vertical signal line 136' may further include a coupling portion cp, and a width wcp of the coupling portion cp is greater than that of other portions of the third vertical signal line 136'. The pixel electrode of the pixel structure 240A may be designed to overlap the coupling portion cp. In this way, even if the line width W136' of the third vertical signal line 136' is less than the line width W132 of the first vertical signal line 132, a coupling capacitance between the pixel structure 240A and the third vertical signal line 136' may be close to a coupling capacitance between the pixel structure 240A and the first vertical signal line 132, such that loads of the first vertical signal line 132 and the third vertical signal line 136' are close or substantially the same.

In the electronic device 700, a line length of the vertical signal line DLA is also greater than that of the vertical signal line DLB'. Therefore, a line width of the vertical signal line DLB' may also be less than that of the vertical signal line DLA, and the vertical signal line DLB' may selectively include the coupling portion cp. In this way, the vertical signal line DLA and the vertical signal line DLB' also have the same signal transmission quality, and the coupling capacitances generated by the pixel structure 240B on the vertical signal line DLA and the vertical signal line DLB' may also be substantially the same to ensure the quality of the electronic device 700.

Figure 9:
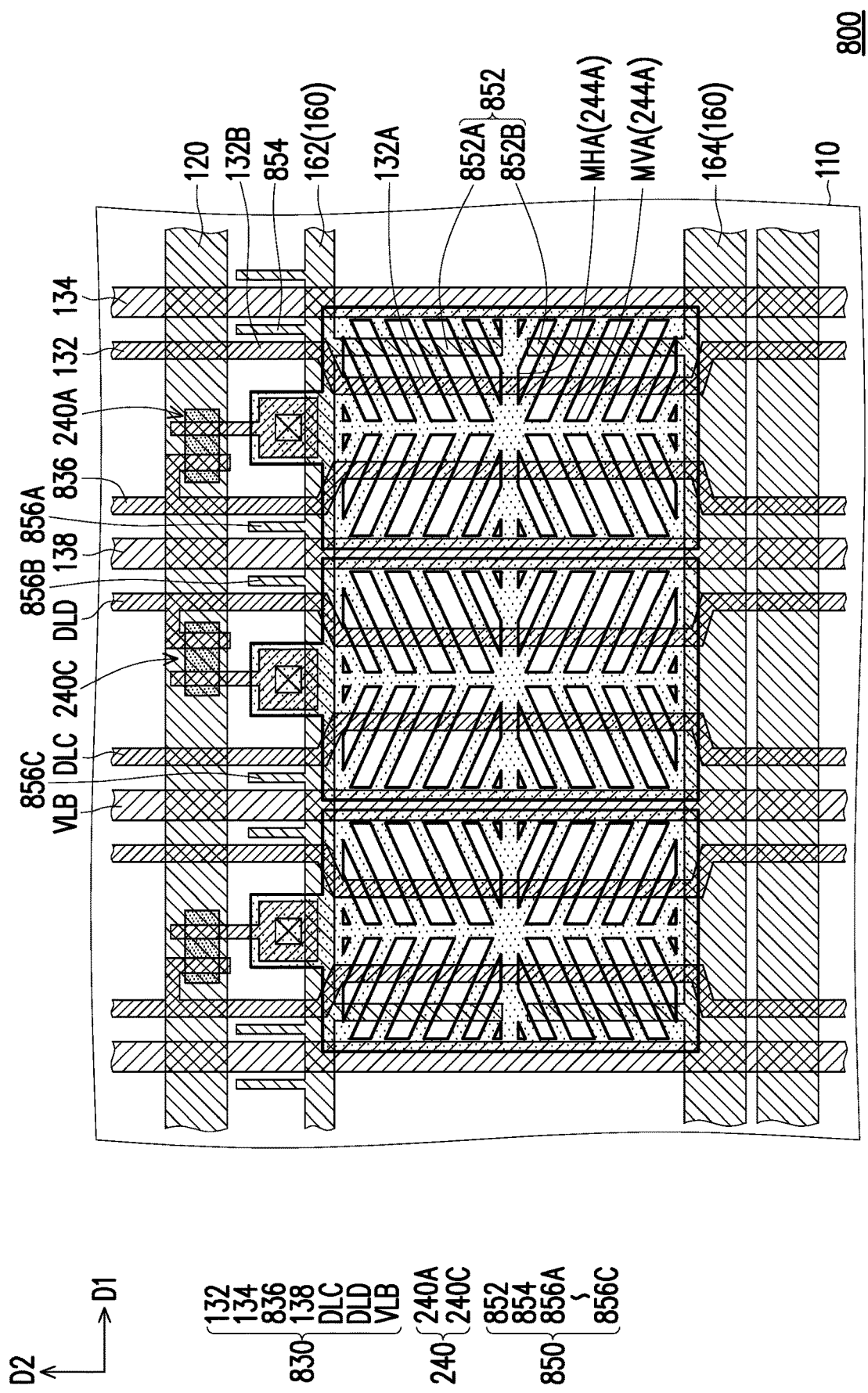
FIG. 9 is a partial schematic top view of an electronic device according to another embodiment of the disclosure.

FIG. 9 is a partial schematic top view of an electronic device according to another embodiment of the disclosure. In an electronic device 800 of FIG. 9, some components are the same as that in the embodiments of FIG. 1 and FIG. 2, so that the same component symbols are used to denote the same components in the these embodiments. The electronic device 800 includes the substrate 110, a plurality of the transversal signal lines 120, a plurality of vertical signal lines 830, a plurality of the pixel structures 240, a plurality of shielding wires 850, and the common electrode line 160. The transversal signal lines 120, the pixel structures 240, the shielding wires 850, and the common electrode line 160 are all disposed on the substrate 110, and for layout designs of the substrate 110, the transversal signal lines 120, the pixel structures 240, and the common electrode line 160, reference may be made to related description of the aforementioned embodiments, and details thereof are not repeated.

The vertical signal lines 830 in FIG. 9 include the first vertical signal line 132, the second vertical signal line 134, a third vertical signal line 836, the fourth vertical signal line 138, and the vertical signal lines DLC, DLD, and VLB. For the layout designs of the first vertical signal line 132, the second vertical signal line 134, the fourth vertical signal line 138, and the vertical signal lines DLC, DLD, and VLB, reference may be made to the related description of FIG. 3, which are not repeated. In the electronic device 800, the pixel structures 240 include the pixel structure 240A disposed between the second vertical signal line 134 and the fourth vertical signal line 138, and the pixel structure 240C disposed between the fourth vertical signal line 138 and the vertical signal line VLB, where for structure designs of the pixel structure 240A and the pixel structure 240C, reference may be made to the description of FIG. 3.

The shielding wires 850 include a shielding wire 852 and a shielding wire 854 between the first vertical signal line 132 and the second vertical signal line 134. For an arrangement relationship of the first vertical signal line 132, the shielding wire 852, the shielding wire 854 and the second vertical signal line 134, reference may be made to the arrangement relationship of the first vertical signal line 132, the shielding wire 252, the shielding wire 254 and the second vertical signal line 134 in FIG. 3. To be specific, the transversal shift section 132A of the first vertical signal line 132 may be further away from the second vertical signal line 134 relative to the adjacent connection section 132B, and the shielding wire 852 is located between the second vertical signal line 134 and the transversal shift section 132A, and the shielding wire 854 is located between the second vertical signal line 134 and the connection section 132B. The shielding wire 854 extends from the first common electrode line 162 in a direction away from the second common electrode line 164, and the shielding wire 852 is disposed between the first common electrode line 162 and the second common electrode line 164.

In the embodiment, the shielding wire 852 includes a first section 852A extending from the first common electrode line 162 toward the second common electrode line 164 and a second section 852B extending from the second common electrode line 164 toward the first common electrode line 162, and the first section 852A is separated from the second section 852B. In some embodiments, the horizontal trunk portion MHA of the pixel electrode 244A may be located between the first section 852A and the second section 852B, and the first section 852A and the second section 852B may not traverse the horizontal trunk portion MHA or even not be overlapped with the horizontal trunk portion MHA, but the disclosure is not limited thereto.

The section where the third vertical signal line 836 is overlapped with the pixel electrode 244A may also be further away from the fourth vertical signal line 138 relative to the adjacent section, but there is no shielding wire between the third vertical signal line 836 and the fourth vertical signal line 138. Moreover, the first vertical signal line 132 and the third vertical signal line 836 are overlapped with the pixel electrode 244A of the pixel structure 240A. The first vertical signal line 132 and the third vertical signal line 836 may be located on two opposite sides of the vertical trunk portion MVA of the pixel electrode 244A, and the first vertical signal line 132 and the third vertical signal line 836 are not overlapped with the vertical trunk portion MVA.

In the embodiment, for the arrangement relationship of the pixel structure 240C with respect to the fourth vertical signal line 138 and the vertical signal lines DLC, DLD, and VLB, reference may be made to the related description of FIG. 3. In addition, the shielding wires 850 in the electronic device 800 further include shielding wires 856A, 856B, and 856C. The shielding wires 856A, 856B, and 856C all extend from the first common signal line 162 toward the adjacent transversal signal line 120 without overlapping with any pixel electrode. The shielding wire 856A is located between the fourth vertical signal line 138 and the third vertical signal line 836, the shielding wire 856B is located between the vertical signal line DLD and the fourth vertical signal line 138, and the shielding wire 856C is located between the vertical signal line DLC and the vertical signal line VLB. The third vertical signal line 836 and the vertical signal lines DLD and DLC are used to transmit data signals, while the fourth vertical signal line 138 and the vertical signal line VLB are used to transmit other signals. The sections of the third vertical signal line 836 and the vertical signal lines DLD and DLC located between the first common electrode line 162 and the corresponding transversal signal line 120 (in the aforementioned embodiment, the connection sections are taken as an example for description) are closer to the adjacent fourth vertical signal line 138 or the vertical signal line VLB. Therefore, the shielding wires 856A, 856B, and 856C are disposed between the connection sections of the signal lines transmitting the data signals and the signal lines not transmitting the data signals, which helps to mitigate the interference between the vertical signal lines 130 and helps to ensure the display performance of the electronic device 800.

Figure 10:
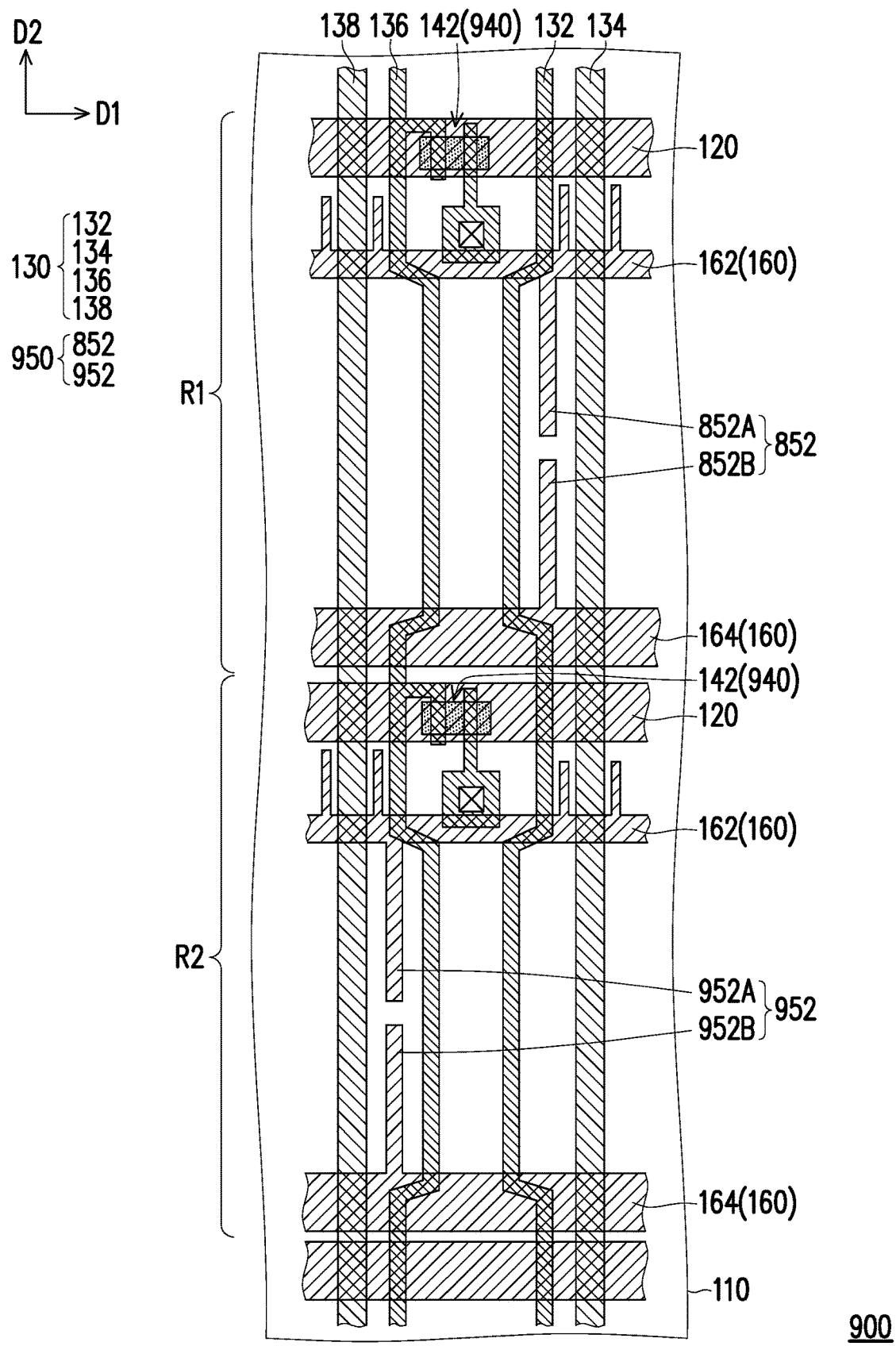
FIG. 10 is a partial schematic top view of an electronic device according to another embodiment of the disclosure.

FIG. 10 is a partial schematic top view of an electronic device according to another embodiment of the disclosure. FIG. 10 only illustrates partial components of an electronic device 900, in which the pixel electrode of each pixel structure is omitted to clearly present a layout arrangement of the signal lines. However, the pixel electrode of each pixel structure may adopt the design of any pixel electrode in the aforementioned embodiments. The signal lines of the electronic device 900 include a plurality of the transversal signal lines 120, a plurality of the vertical signal lines 130, a plurality of common electrode lines 160, and a plurality of shielding wires 950, and the electronic device 900 includes a plurality of pixel structures 940, where each pixel structure 940 may include the active device 142 and the pixel electrode that is not shown.

In the embodiment, the vertical signal lines 130 include the first vertical signal line 132, the second vertical signal line 134, the third vertical signal line 136, and the fourth vertical signal line 138. The pixel structures 940 are arranged in a plurality of rows between the second vertical signal line 134 and the fourth vertical signal line 138. In addition, the first vertical signal line 132 and the third vertical signal line 136 are located between the second vertical signal line 134 and the fourth vertical signal line 138, and the first vertical signal line 132 and the third vertical signal line 136 may be, for example, overlapped with the pixel electrode of each pixel structure 940.

The shielding wires 950 of the electronic device 900 include the shielding wire 852 disposed in a first row R1 and a shielding wire 952 disposed in a second row R2. The shielding wire 852 extends between the first common electrode line 162 and the second common electrode line 164 of the first row R1, and is located between the first vertical signal line 132 and the second vertical signal line 134. The shielding wire 952 extends between the first common electrode line 162 and the second common electrode line 164 of the second row R2, and is located between the third vertical signal line 136 and the fourth vertical signal line 138. In the first row R1, there is no shielding wire between the third vertical signal line 136 and the fourth vertical signal line 138, and in the second row R2, there is no shielding wire between the first vertical signal line 132 and the second vertical signal line 134. However, in other embodiments, the shielding wire 852 of the first row R1 and the shielding wire 952 of the second row R2 may be both disposed between the first vertical signal line 132 and the second vertical signal line 134 or both disposed between the third vertical signal line 136 and the fourth vertical signal line 138.

For the structure of the shielding wire 852, reference may be made to the description of FIG. 9, which includes the first section 852A and the second section 852B, and the first section 852A and the second section 852B are separated from each other. Similarly, the shielding wire 952 may include a first section 952A and a second section 952B, and the first section 952A and the second section 952B are separated from each other. However, in other embodiments, the shielding wire 852 and the shielding wire 952 may continuously extend between the corresponding first common electrode line 162 and the second common electrode line 164.

In summary, the electronic device of each embodiment of the disclosure includes the shielding wires disposed between the adjacent vertical signal lines to reduce the interference between the adjacent signal lines, thereby ensuring the quality of the electronic device. Moreover, the shielding wires and the vertical signal lines may be disposed corresponding to the pixel structures, so that the pixel structures may present a closed display effect at each viewing angle.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:
    a substrate;
    a plurality of transversal signal lines, extending in a first direction, disposed on the substrate;
    a first vertical signal line, extending in a second direction, disposed on the substrate, intersected with the transversal signal lines;
    a second vertical signal line, disposed on the substrate, intersected with the transversal signal lines, connected to one of the transversal signal lines;
    a shielding wire, wherein an orthogonal projection of the shielding wire on the substrate is located between an orthogonal projection of the first vertical signal line on the substrate and an orthogonal projection of the second vertical signal line on the substrate; and
    a plurality of pixel structures, wherein one of the pixel structures is surrounded by a corresponding one of the transversal signal lines and the second vertical signal line and comprises an active device, wherein a gate of the active device is electrically connected to the corresponding one of the transversal signal lines, and a source of the active device is electrically connected to the first vertical signal line,
    wherein the first vertical signal line comprises a transversal shift section, and one of the pixel structures further comprises a pixel electrode, the pixel electrode is connected to a drain of the active device, and the pixel electrode is overlapped with the transversal shift section and the shielding wire.

2. The electronic device according to claim 1, further comprising a common electrode line, wherein the common electrode line is located between two of the transversal signal lines, and the shielding wire is connected to the common electrode line.

3. The electronic device according to claim 1, wherein the shielding wire and the transversal signal lines are of a same film layer, and the shielding wire is located between adjacent two of the transversal signal lines.

4. The electronic device according to claim 1, wherein the first vertical signal line and the second vertical signal line are of a same film layer.

5. The electronic device according to claim 1, further comprising:
    a third vertical signal line, intersected with the transversal signal lines, wherein the first vertical signal line is located between the third vertical signal line and the shielding wire; and
    a fourth vertical signal line, intersected with the transversal signal lines, wherein the first vertical signal line and the third vertical signal line are located between the second vertical signal line and the fourth vertical signal line.

6. The electronic device according to claim 5, wherein the third vertical signal line comprises another transversal shift section, and the transversal shift section of the first vertical signal line is located between the another transversal shift section of the third vertical signal line and the shielding wire.

7. The electronic device according to claim 6, wherein a distance between the another transversal shift section of the third vertical signal line and the fourth vertical signal line is less than a distance between the transversal shift section of the first vertical signal line and the second vertical signal line.

8. The electronic device according to claim 6, wherein a distance between the another transversal shift section of the third vertical signal line and the transversal shift section of the first vertical signal line is equal to a distance between the shielding wire and the transversal shift section of the first vertical signal line.

9. The electronic device according to claim 6, wherein a width of one of the pixel structures is divided into a first width, a second width, a third width, and a fourth width sequentially arranged from the second vertical signal line toward the fourth vertical signal line by the shielding wire, the transversal shift section, and the another transversal shift section, and a sum of the first width, the second width, and the third width is 0.8 to 1.2 times of the fourth width.

10. The electronic device according to claim 6, wherein a line width of the third vertical signal line is less than a line width of the first vertical signal line.

11. The electronic device according to claim 10, wherein the third vertical signal line further comprises a coupling portion, and a width of the coupling portion is greater than that of other portions of the third vertical signal line.

12. The electronic device according to claim 10, wherein a line length/the line width of the first vertical signal line is a first ratio, a line length/the line width of the third vertical signal line is a second ratio, and a ratio of the first ratio to the second ratio ranges from 0.8 to 1.2.

13. The electronic device according to claim 6, further comprising:

another shielding wire, disposed between the another transversal shift section and the fourth vertical signal line.

14. The electronic device according to claim 1, wherein the pixel electrode comprises a vertical trunk portion and a plurality of oblique stripe portions, and the oblique stripe portions are connected to the vertical trunk portion.

15. The electronic device according to claim 1, wherein the pixel electrode comprises a first sub-electrode and a second sub-electrode, the first sub-electrode comprises a first vertical trunk portion and a plurality of first oblique stripe portions, the first oblique stripe portions are connected to the first vertical trunk portion, the second sub-electrode comprises a second vertical trunk portion and a plurality of second oblique stripe portions, the second oblique stripe portions are connected to the second vertical trunk portion, and the first sub-electrode is located between the second sub-electrode and the second vertical signal line.

16. The electronic device according to claim 15, wherein the shielding wire is overlapped with the first vertical trunk portion.

17. The electronic device according to claim 1, wherein the second vertical signal line is located between adjacent two of the pixel structures, and one of the adjacent two of the pixel structures is a red pixel structure and the other is a blue pixel structure.

18. The electronic device according to claim 1, further comprising a first common electrode line and a second common electrode line, located between two adjacent transversal signal lines, the shielding wire comprises a first section extending from the first common electrode line toward the second common electrode line and a second section extending from the second common electrode line toward the first common electrode line, and the first section is separated from the second section.

19. An electronic device, comprising:
a plurality of transversal signal lines;
a first vertical signal line, intersected with the transversal signal lines;
a second vertical signal line, intersected with the transversal signal lines, connected to one of the transversal signal lines;
a shielding wire, wherein the shielding wire is located between the first vertical signal line and the second vertical signal line from a top view; and
a plurality of pixel structures, wherein one of the pixel structures is surrounded by a corresponding one of the transversal signal lines and the first vertical signal line and comprises an active device and a pixel electrode, wherein a gate of the active device is electrically connected to the corresponding one of the transversal signal lines, a source of the active device is electrically connected to the first vertical signal line, the pixel electrode is electrically connected to a drain of the active device, and the first vertical signal line is overlapped with the pixel electrode,
wherein the first vertical signal line comprises a transversal shift section, the pixel electrode is connected to the drain of the active device, and the pixel electrode is overlapped with the transversal shift section and the shielding wire.

20. An electronic device, comprising:
a substrate;
a plurality of transversal signal lines, extending in a first direction, disposed on the substrate;
a first vertical signal line, extending in a second direction, disposed on the substrate, intersected with the transversal signal lines;
a second vertical signal line, disposed on the substrate, intersected with the transversal signal lines, connected to one of the transversal signal lines;
a shielding wire, wherein an orthogonal projection of the shielding wire on the substrate is located between an orthogonal projection of the first vertical signal line on the substrate and an orthogonal projection of the second vertical signal line on the substrate;
a plurality of pixel structures, wherein one of the pixel structures is surrounded by a corresponding one of the transversal signal lines and the second vertical signal line and comprises an active device, wherein a gate of the active device is electrically connected to the corresponding one of the transversal signal lines, and a source of the active device is electrically connected to the first vertical signal line;
a third vertical signal line, intersected with the transversal signal lines, wherein the first vertical signal line is located between the third vertical signal line and the shielding wire; and
a fourth vertical signal line, intersected with the transversal signal lines, wherein the first vertical signal line and the third vertical signal line are located between the second vertical signal line and the fourth vertical signal line,
wherein the first vertical signal line comprises a transversal shift section, the third vertical signal line comprises another transversal shift section, and the transversal shift section of the first vertical signal line is located between the another transversal shift section of the third vertical signal line and the shielding wire.

* * * * *